United States Patent
Hales et al.

(10) Patent No.: US 7,081,845 B2
(45) Date of Patent: Jul. 25, 2006

(54) CURRENT MODE ANALOG-TO-DIGITAL CONVERTER

(75) Inventors: Rex K. Hales, Kearns, UT (US); David Blaine, Holladay, UT (US); Marshall A. Soares, Taylorsville, UT (US)

(73) Assignee: SLICEX, Inc., Draper, UT (US)

( * ) Notice: Subject to any disclaimer, the term of this patent is extended or adjusted under 35 U.S.C. 154(b) by 0 days.

(21) Appl. No.: 11/133,066

(22) Filed: May 18, 2005

(65) Prior Publication Data

US 2006/0017598 A1    Jan. 26, 2006

Related U.S. Application Data

(60) Provisional application No. 60/572,384, filed on May 18, 2004.

(51) Int. Cl.
*H03M 1/34* (2006.01)

(52) U.S. Cl. .................................. 341/158; 341/155

(58) Field of Classification Search ........ 341/135–162; 365/185.03, 185
See application file for complete search history.

(56) References Cited

U.S. PATENT DOCUMENTS

| | | | | |
|---|---|---|---|---|
| 5,579,006 | A | * | 11/1996 | Hasegawa et al. ........... 341/162 |
| 5,729,490 | A | * | 3/1998 | Calligaro et al. ...... 365/185.03 |
| 5,854,563 | A | * | 12/1998 | Oh et al. ........................ 327/74 |
| 5,963,158 | A | * | 10/1999 | Yasuda ....................... 341/136 |
| 6,008,673 | A | * | 12/1999 | Glass et al. .................... 327/77 |
| 6,037,890 | A | * | 3/2000 | Glass et al. .................. 341/159 |
| 6,039,733 | A | * | 3/2000 | Buysse et al. ................ 606/40 |
| 6,121,913 | A | * | 9/2000 | Glass et al. .................. 341/159 |
| 6,239,733 | B1 | * | 5/2001 | Lin ............................. 341/159 |

* cited by examiner

*Primary Examiner*—Lam T. Mai
(74) *Attorney, Agent, or Firm*—Steven L. Nichols; Rader, Fishman & Grauer PLLC

(57) ABSTRACT

A method of converting an analog signal to a digital signal includes comparing an input current to one or more reference currents to generate the desired digital signal. An Analog-to-Digital Converter includes a plurality of current comparators; and a plurality of current references providing reference currents to the comparators.

19 Claims, 40 Drawing Sheets

CURRENT MODE ANALOG-TO-DIGITAL CONVERTER

RELATED APPLICATION

The present application claims the priority under 35 U.S.C. § 119(e) of previous Provisional Patent Application No. 60/572,384, filed May 18, 2004, entitled "High Sample Rate, Current Mode Analog to Digital Converter Using CMOS Sense Amp Techniques," which provisional application is hereby incorporated by reference in its entirety.

BACKGROUND

Historically, engineers have been trained to design circuits in terms of voltage. While analyzing circuits, a designer typically concentrates on the voltage at each node. When doing integrated circuit analysis, designers look at the voltage change on the output due to a voltage change on the Input. Circuit simulators also follow this approach by constructing matrices of nodes to solve for node voltages. On the test bench, voltage sources are used to operate circuits under test, and test equipment measures voltage.

Over the years, integrated circuits have seen incredible increases in density. With each reduction in feature size, there has also been a reduction in optimal operating voltage. These decreases in operating voltage have required reductions in threshold voltages in an attempt to maintain noise margins. Analog circuits, particularly analog-to-digital converters (ADCs) have suffered from this reduction, and are typically designed with higher voltage transistors and operating voltages than are available to digital designers.

In a typical voltage mode ADC, the voltage being sampled is stored on a capacitor. It can be shown that the minimum size of the capacitor storing the voltage must be $>kT/(Vn^2)$, where k is Boltzman's constant, T is temperature in Kelvin, and Vn is the size of the largest noise signal, usually less than ¼ of the ADC's least significant bit (LSB), that can be tolerated to give a low probability of error. As the operating voltage is reduced due to newer processes, the minimum capacitor size increases. This increases both the size of the circuit and the power used.

The accuracy of a voltage mode circuit, including a voltage mode ADC, is determined by the size of the capacitance used to store the voltage. The speed of a voltage mode circuit is consequently affected by circuit capacitance and parasitic capacitance. The nodes of a voltage mode circuit must change voltage during operation of the circuit over a range that is often approximately the entire voltage range of the power supply voltage. Changing the voltage requires that the circuit and parasitic capacitances must charge and discharge. Smaller integrated circuit geometries have been able to reduce circuit capacitance, at the cost of smaller supply voltages, which has a negative impact on noise margins.

SUMMARY

The present invention provides an ADC based on currents rather than voltages using, for example, sense amps functioning as current comparators.

BRIEF DESCRIPTION OF THE DRAWINGS

The accompanying drawings illustrate various embodiments of the present invention and are a part of the specification. Together with the following description, the drawings demonstrate and explain the principles of the present invention. The illustrated embodiments are examples of the present invention and do not limit the scope of the invention.

Throughout the drawings, identical reference numbers designate identical elements.

DETAILED DESCRIPTION

Figure 1:
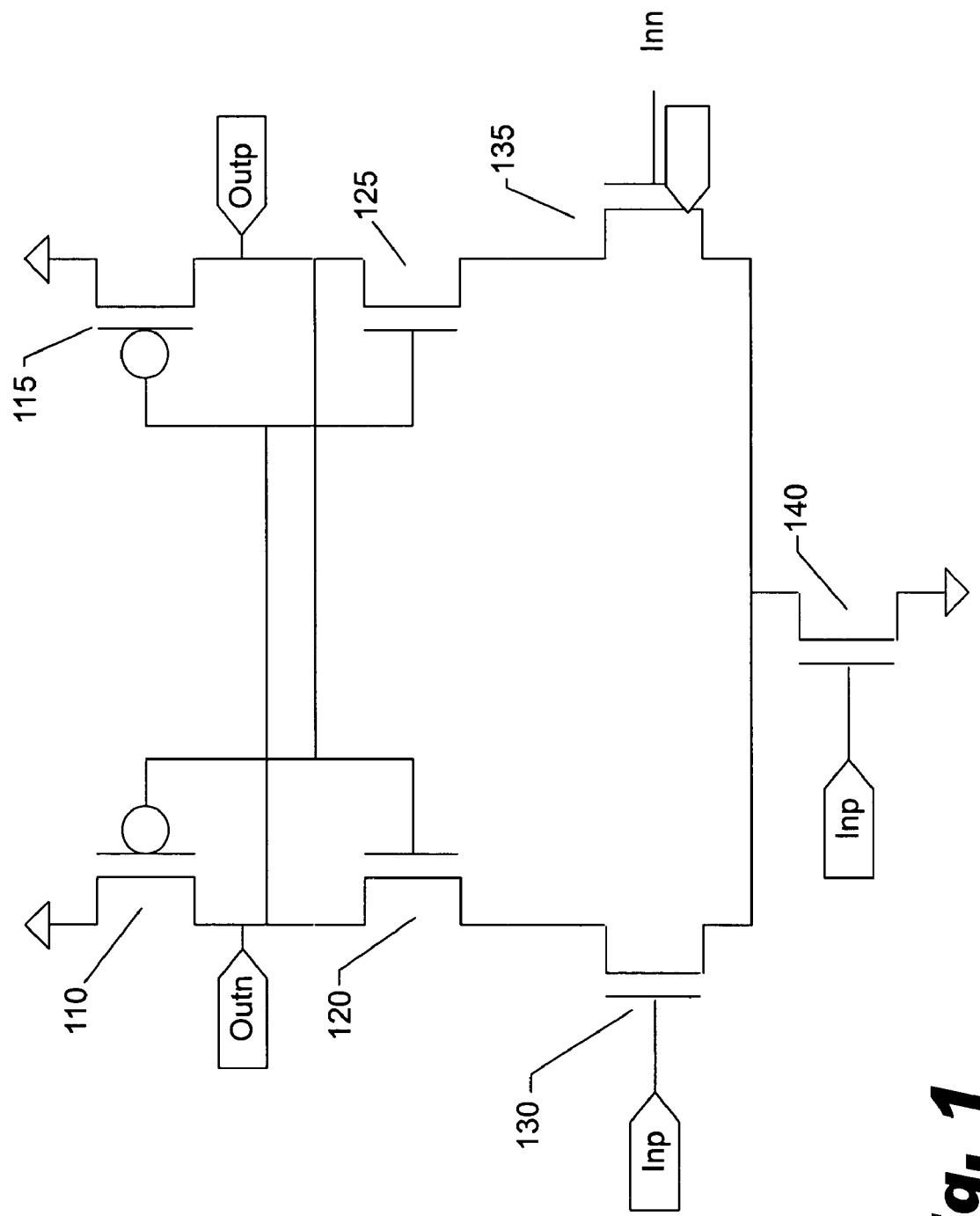
FIG. 1 shows a simplified schematic of a sense amp comparator.

The present specification describes, among other things, a current mode analog-to-digital converter (ADC). The current mode ADC operates, for example, by comparing an Input current to one or more reference currents to create a digital representation of the incoming signal. The ADC described herein may be used for a variety of applications including but not limited to, battery level measurement (metering), communications, imaging, measurement, control systems, sensors, etc.

As described above, traditional ADC circuit design is done in terms of voltage. However, in some embodiments, ADCs may be designed in terms of currents rather than voltages. Current and voltage are related by Ohm's law. Circuits are designed in terms of voltage merely for the convenience for the typical designer. However, there are several advantages to designing in terms of current.

In the field of analog-to-digital conversion, voltage mode ADC's compare an Input voltage to reference voltages to determine which reference voltage is closest to the value of the Input. A digital representation of the Input signal is then created based on a series of such comparisons.

As described herein, the same principles can be applied to currents. An Input current can be compared to a set of current references to determine which reference current is closest to the Input current.

One of the many values of this approach is that, since current sources are used rather than voltage references, operational voltage becomes far less important. By allowing lower operating voltages to be used, the ADC can take better advantage of the increases in modem integrated circuit density. Also, since the voltages at nodes in a current mode circuit change very little, circuit and parasitic capacitances have much less effect on the speed of the circuit.

As described herein, a current based ADC design uses a comparator that is configured to compare two currents and output a digital value dependent on which current is larger. The sense amp, which has been used in Random Access Memory (RAM) technology, can provide such a comparator. Sense amps are traditionally used to differentially compare true and complement outputs of a RAM bit to determine its value on read.

Since the sense amp compares current values differentially, it avoids problems with parasitic capacitances on the bit lines. Current differences can be detected accurately at very high speeds without the need to wait for the voltages to slew to final values, the timing of which is very sensitive to parasitic capacitance.

Another current comparator that can be used in a current mode ADC is the current comparator often used in Read Only Memory (ROM) technology.

In a specific example described herein, a current mode, flash ADC is composed of 2^N sense amp comparators and current references, where N is the number of bits output for each comparison. This flash ADC can also be used as a building block in other types of ADCs such as a sub-ranging ADC, pipelined ADC, Sigma-Delta Modulator, Successive Approximation ADC and others.

The exemplary current mode flash ADC may be embodied as a 4 bit ADC with the ability for conversion of analog-to-digital signals at a rate of 1 Giga-Sample per Second (GSPS). This ADC is composed of 16 differential current comparators. The reference Inputs are composed of 16 current sources generated by mirroring current from a single current source. Since it is a flash ADC, the value of the Input does not have to be stored, therefore there are no capacitors required by the design. The current comparators and current mirrors can be easily scaled according to process geometries. Since the ADC is based on current, it has little dependence on the value of the power supply voltage.

FIG. 1 shows a simplified schematic of what is commonly called a sense amp comparator. The comparator is able to detect very small voltage changes on Inp and Inn nodes. Typically in a RAM application, the Inp and Inn nodes are charged to the supply voltage while the clk node is held low. When clk goes high, Inp or Inn starts to change voltage as the RAM cell discharges the capacitance of the Inp or Inn signal. At the same time the NMOS transistor (140) turns on and causes a current to start flowing in transistors (130) and (135). This current is proportional to the voltage at the gates of transistors (130) and (135). NMOS transistor (120) and NMOS transistors (110) together form an inverter with the output labeled Outn and the input as Outp. NMOS transistor (125) and NMOS transistor (115) form an inverter with the output labeled Outp and input as Outn. These transistors provide positive feedback that gives the circuit much higher gain than just the gain of the differential pair formed by transistors (130) and (135).

Figure 2:
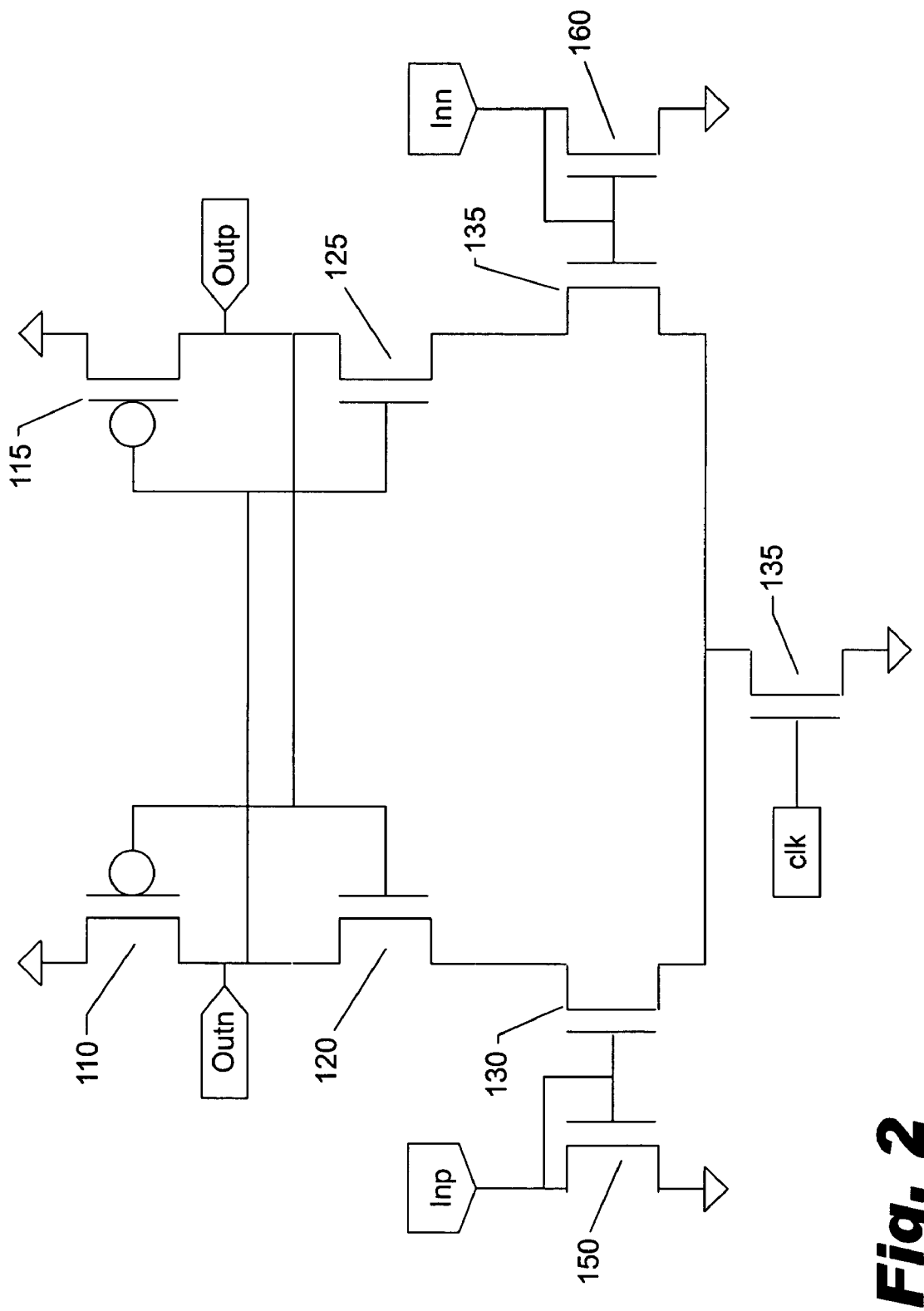
FIG. 2 shows a modification of the sense amp comparator of FIG. 1 including a current mirror according to principles described herein.

FIG. 2 shows a modification of the sense amp of FIG. 1 which gives a simple current mirror Input to the sense amp comparator. NMOS transistors (150) and (160) have been added to the configuration shown previously FIG. 1 to form a current mirror configuration. When clk is high, the current in transistor (130) will be the same as transistor (150) due to both transistors having the same gate voltage and nearly the same drain voltage as the drain voltage of transistor (130) is pulled nearly to ground by NMOS transistor (135). By the same token, the current in transistor (135) will be the same as transistor (160). Hence, the configuration shown in FIG. 2 may be used directly as a current comparator.

As explained above, the comparator of FIG. 2 can be used to give a digital output of "1" or "high" if the current into the Inp input is greater than the current into the Inn input. As will be described below, this current comparator can be used in a current-based ADC.

Figure 3:
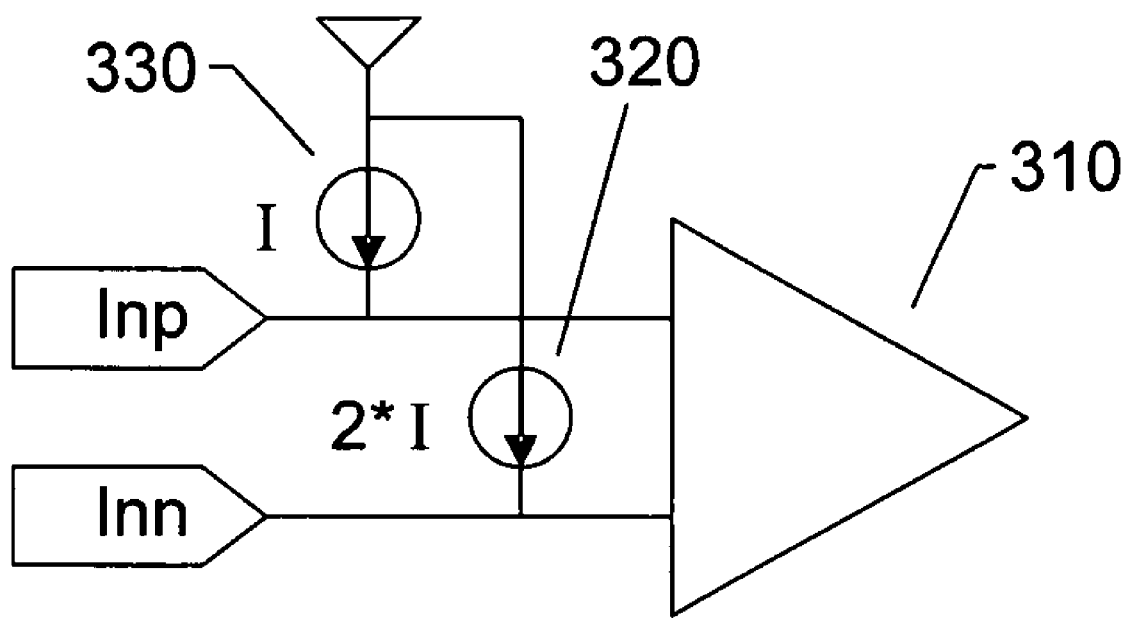
FIG. 3 shows the modified sense amp comparator of FIG. 2 as a block with current sources used to adjust current levels.

FIG. 3 shows the comparator of FIG. 2 as a block (310). Current sources (320) and (330) add current to the currents in the Inp and Inn Inputs. These additional currents can be set to provide thresholds for the comparator so that the current into Inp must be two or more times greater than the current coming in from Inn for the comparator to be high. This principle can be used to create an ADC that uses currents for references.

Figure 4:
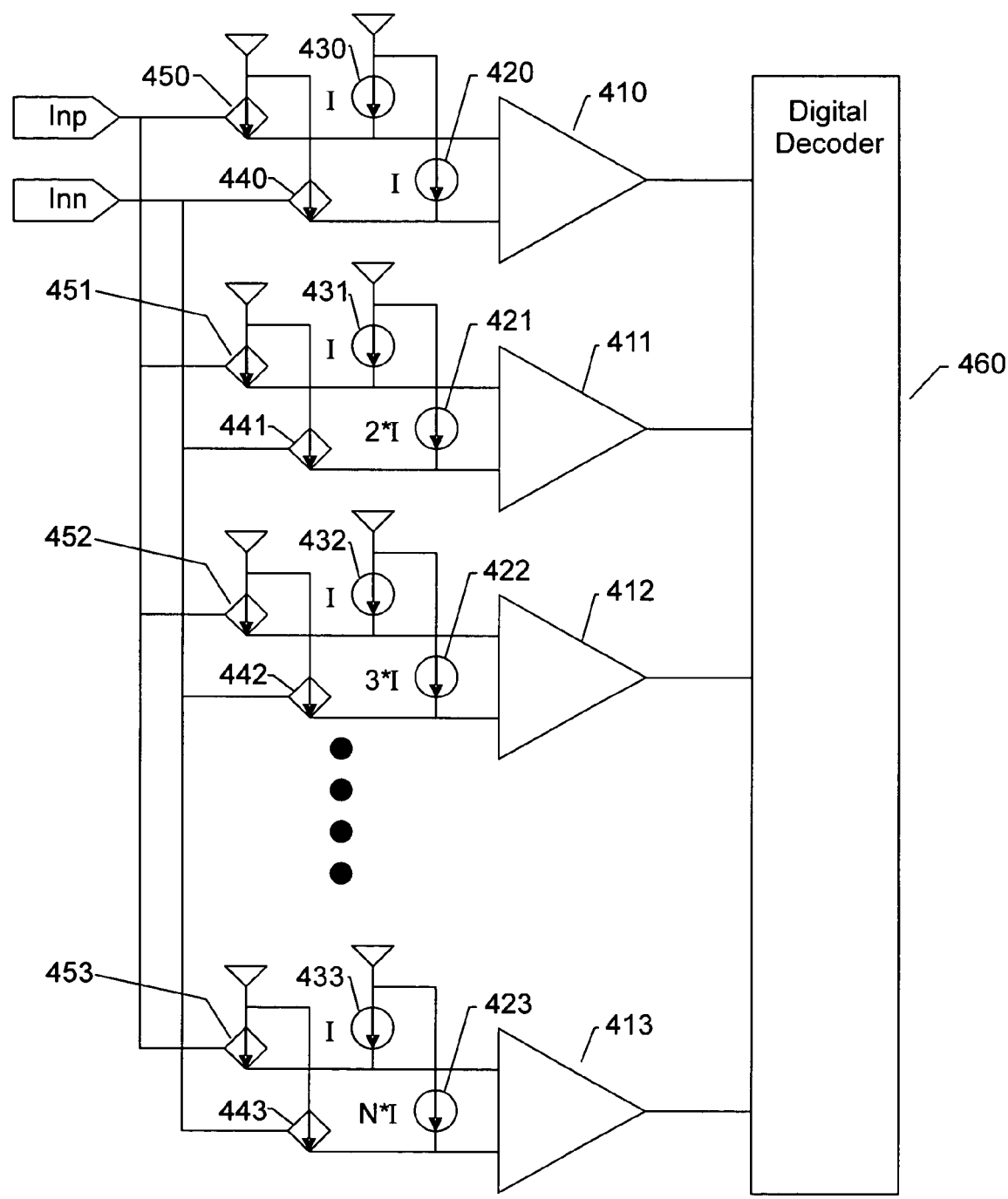
FIG. 4 shows a current-mode ADC according to principles described herein.
Figure 5:
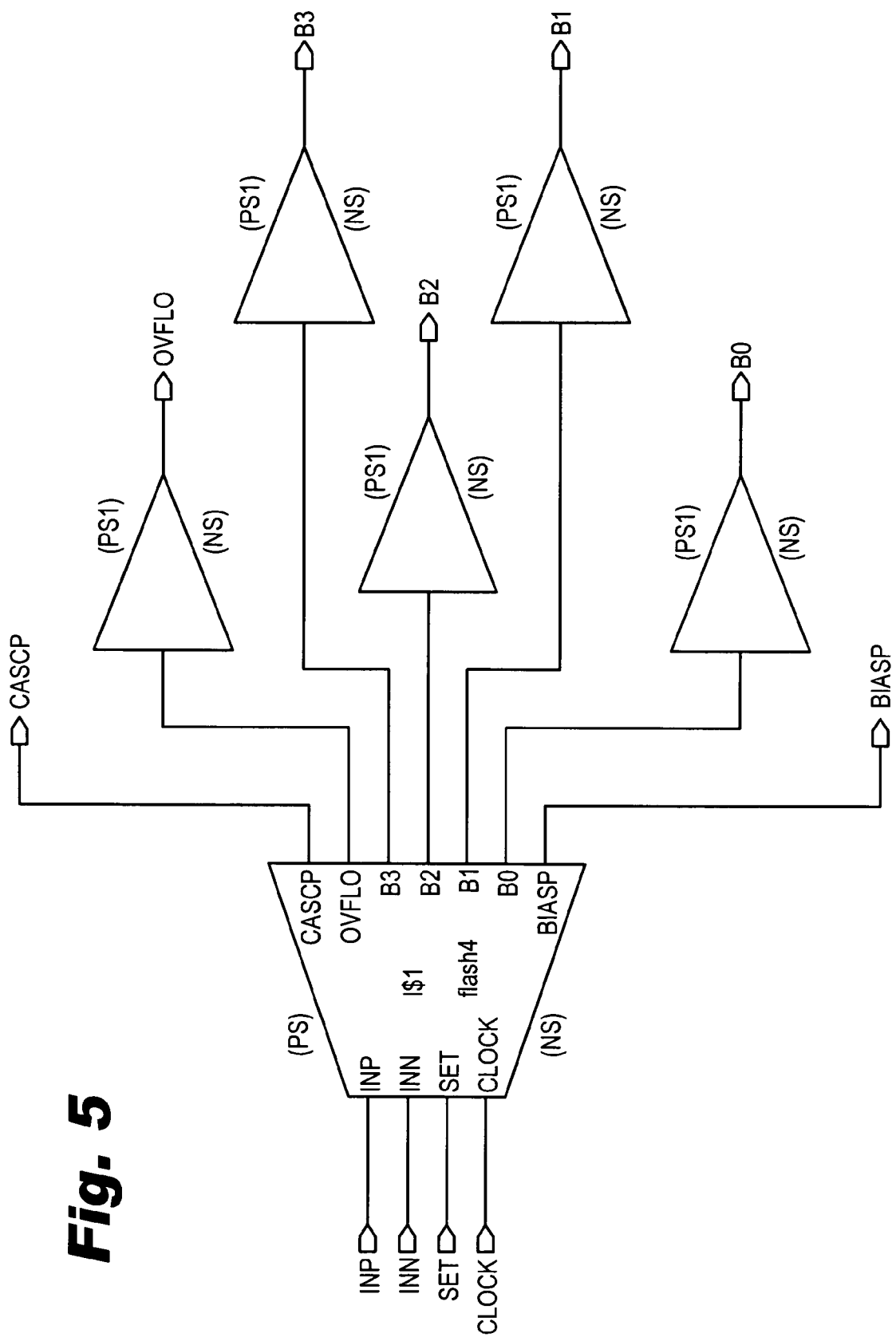
FIGS. 5–40 show various alternative embodiments of an ADC according to principles described herein.
Figure 6:
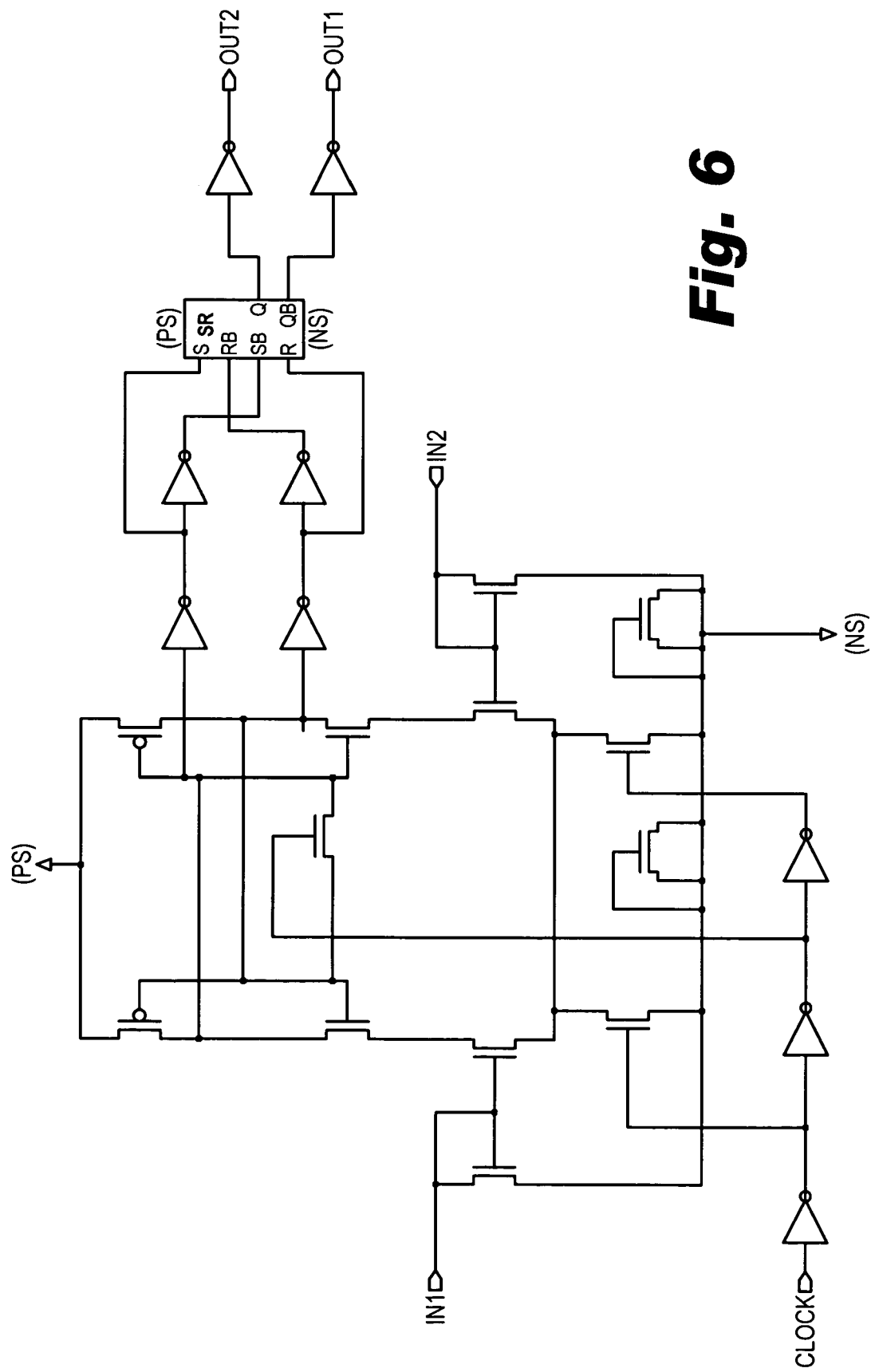
Figure 7:
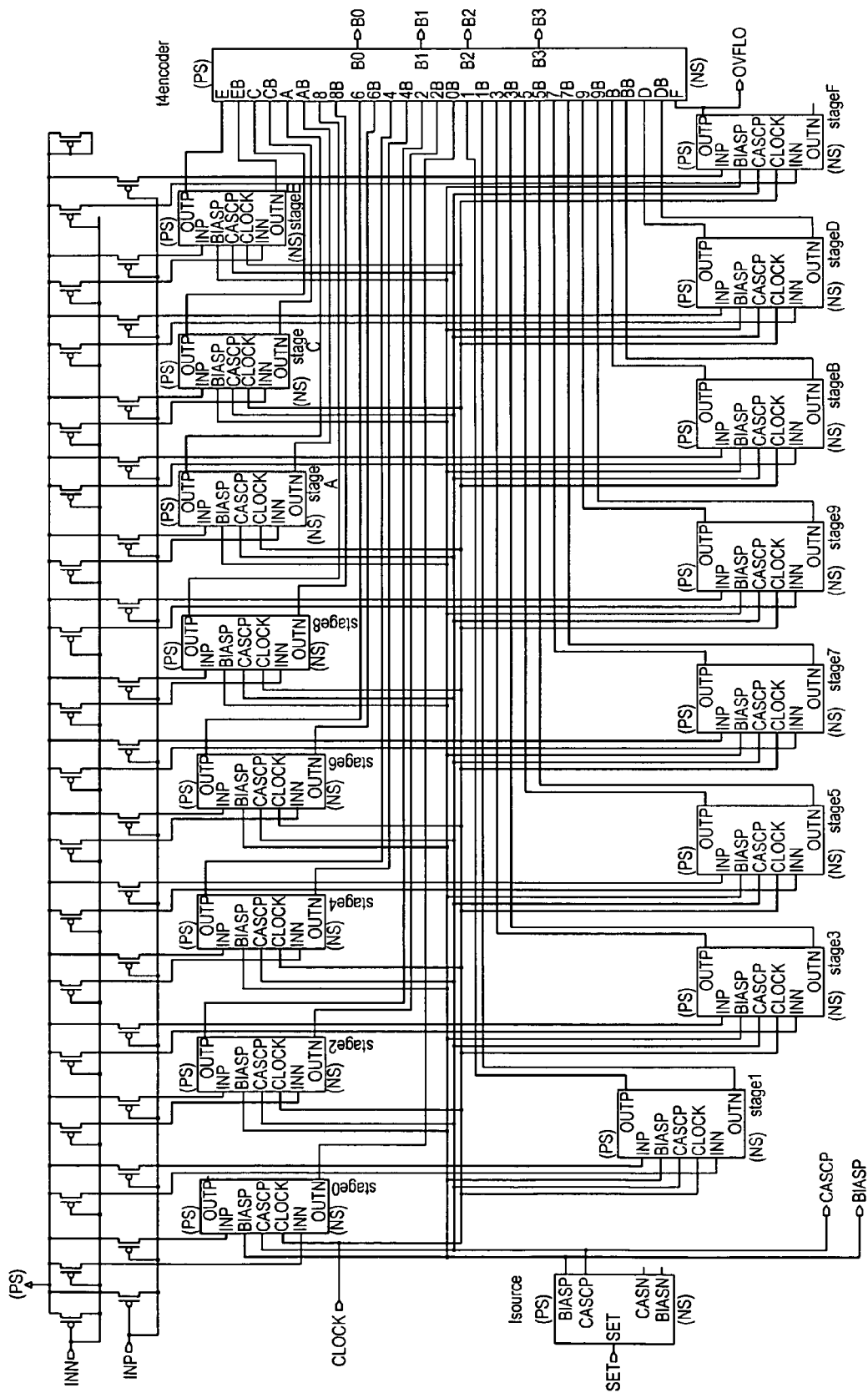
Figure 8:
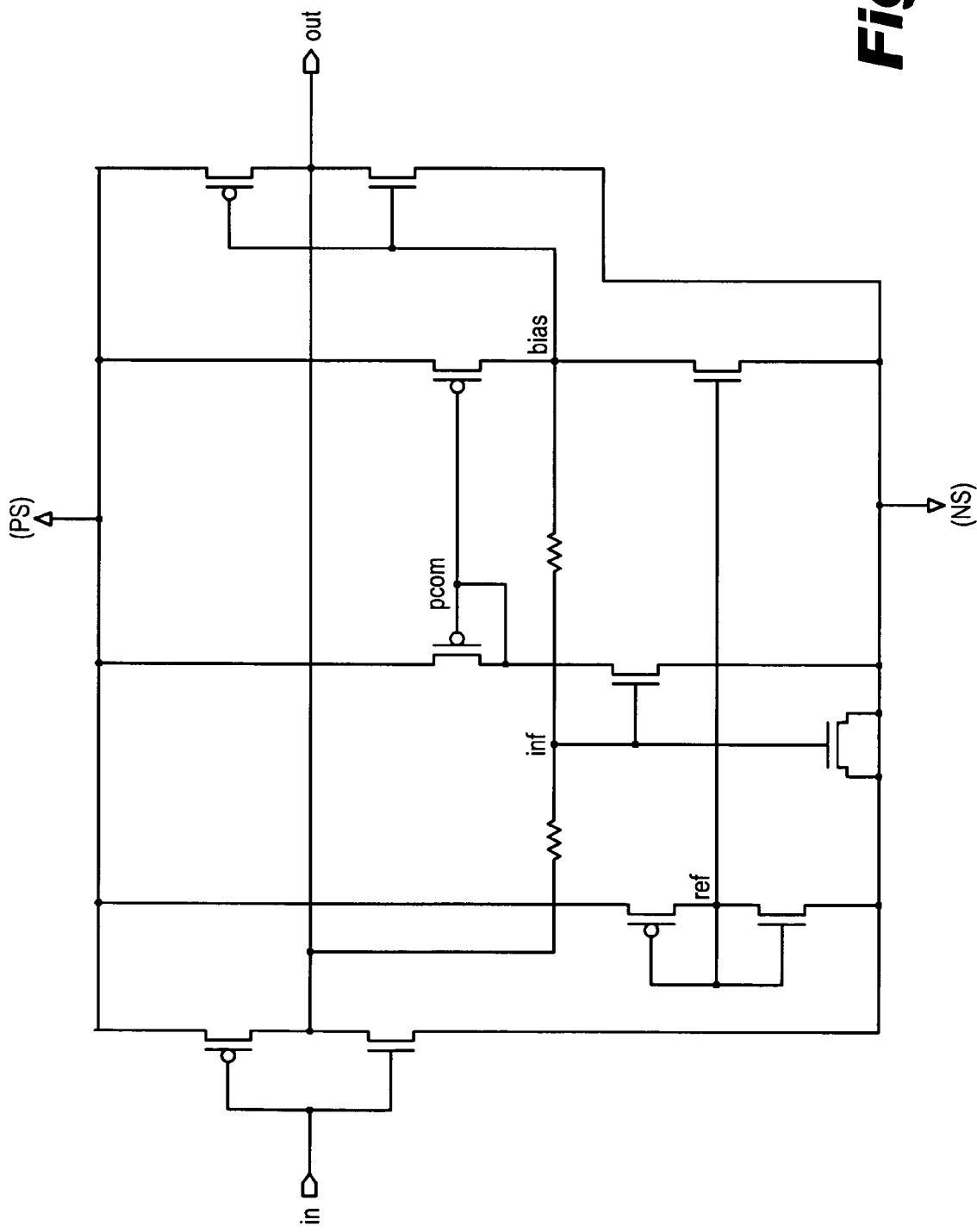
Figure 9:
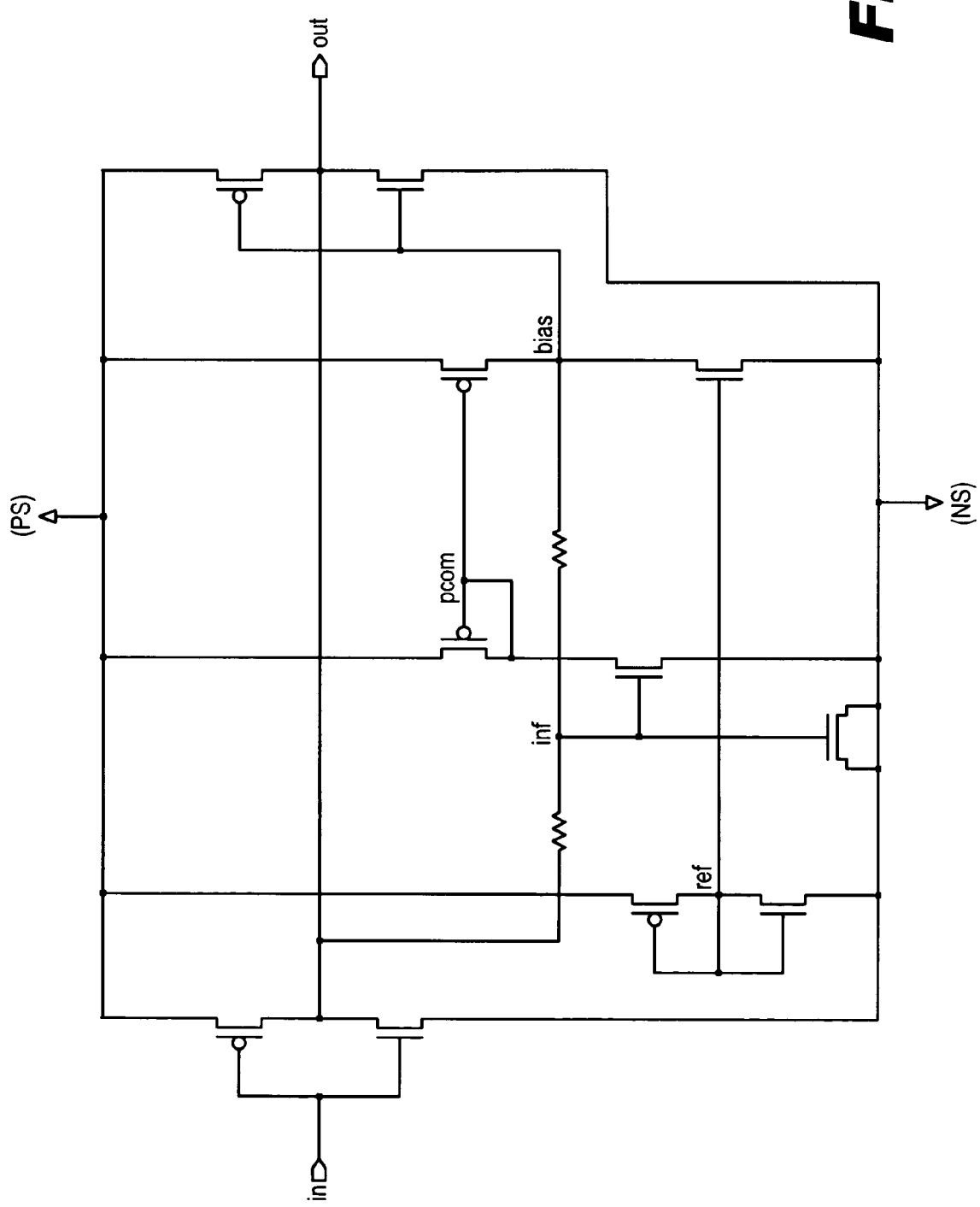
Figure 10:
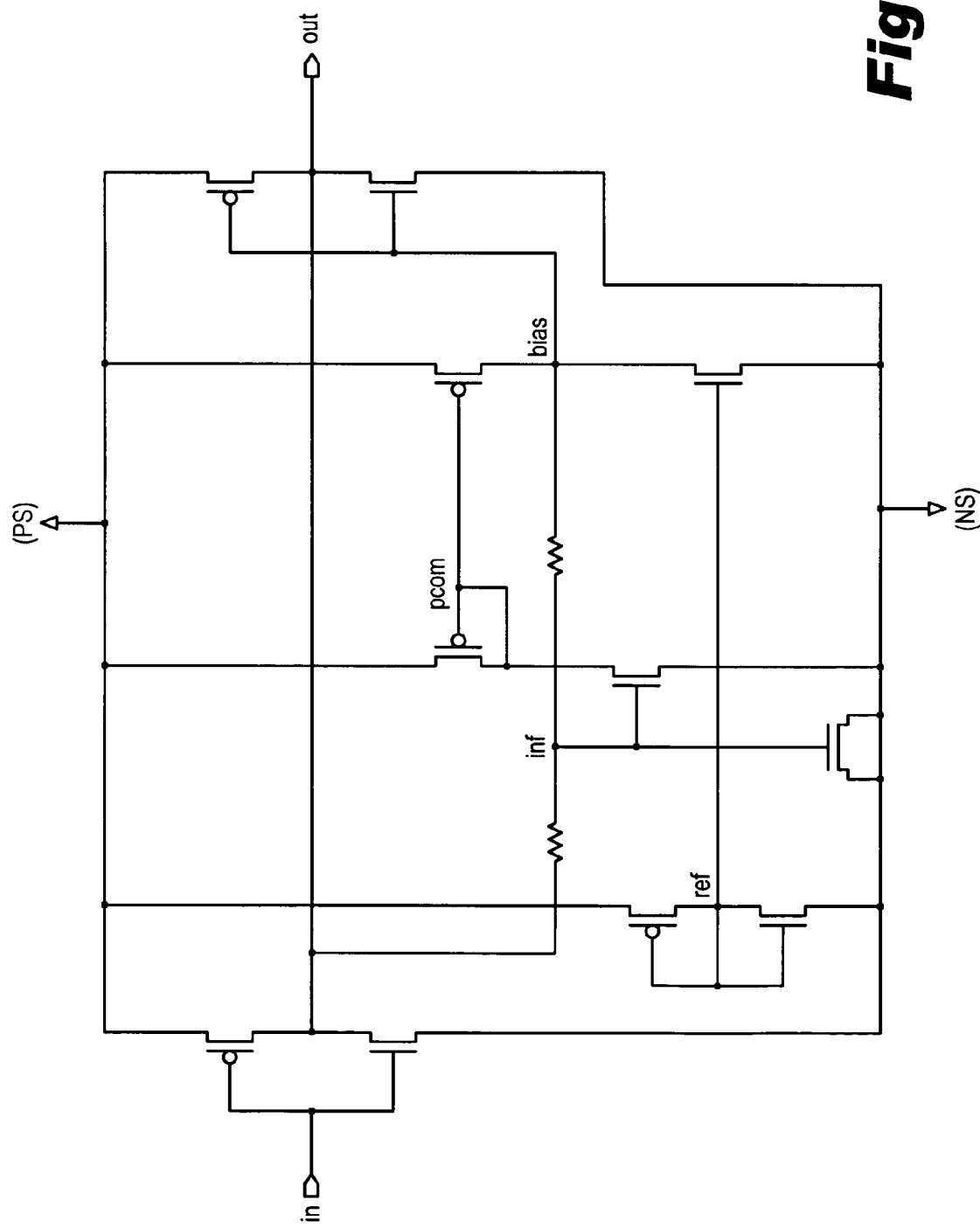
Figure 11:
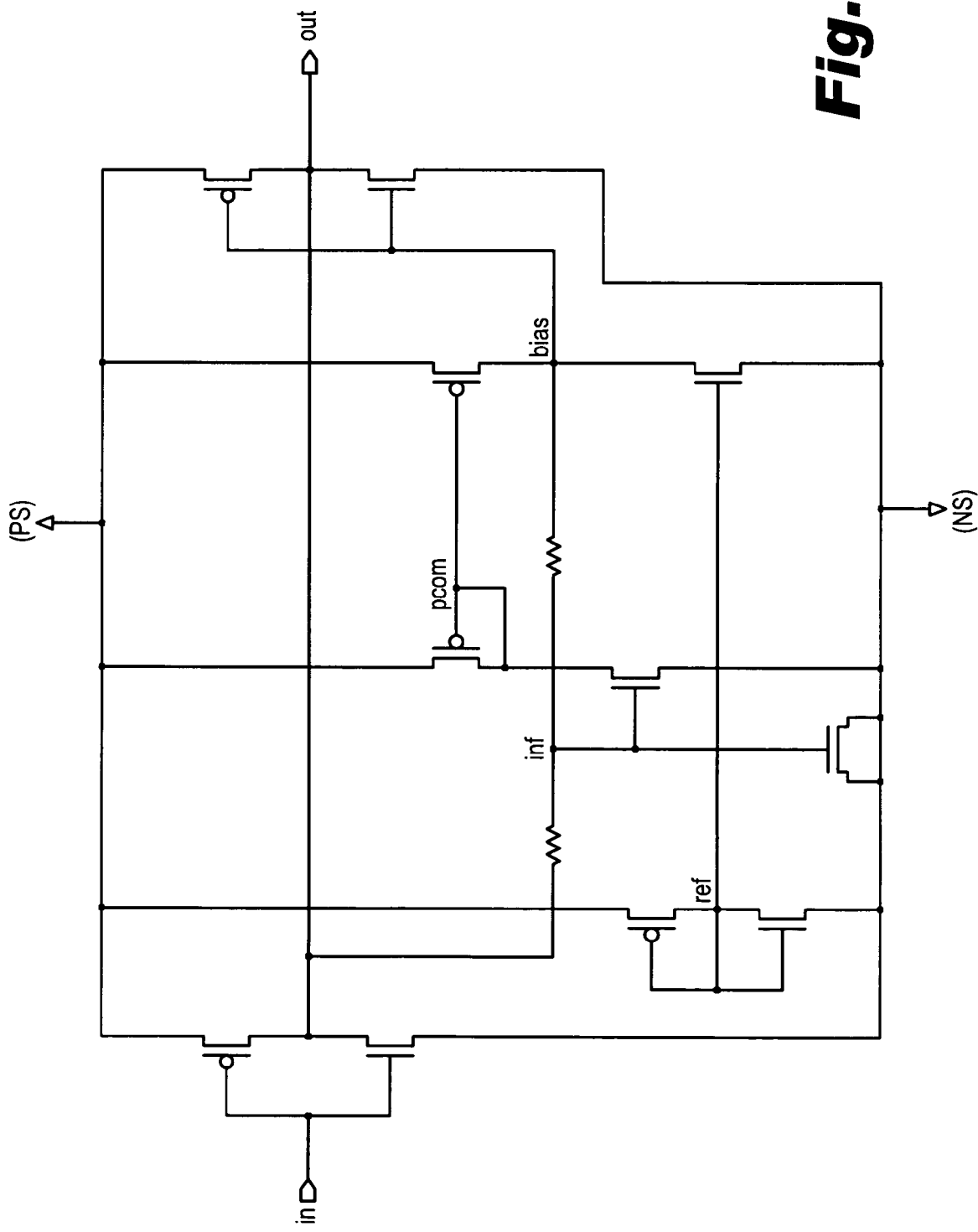
Figure 12:
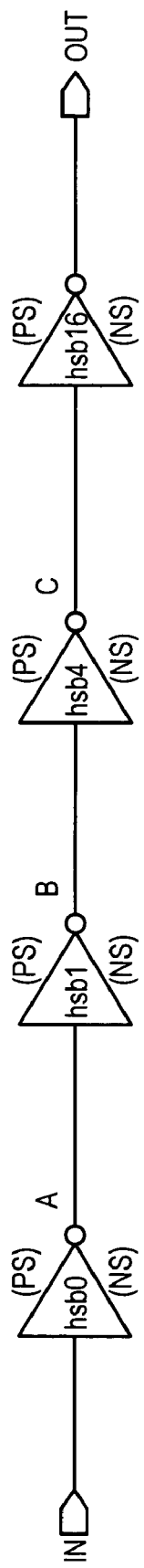
Figure 13:
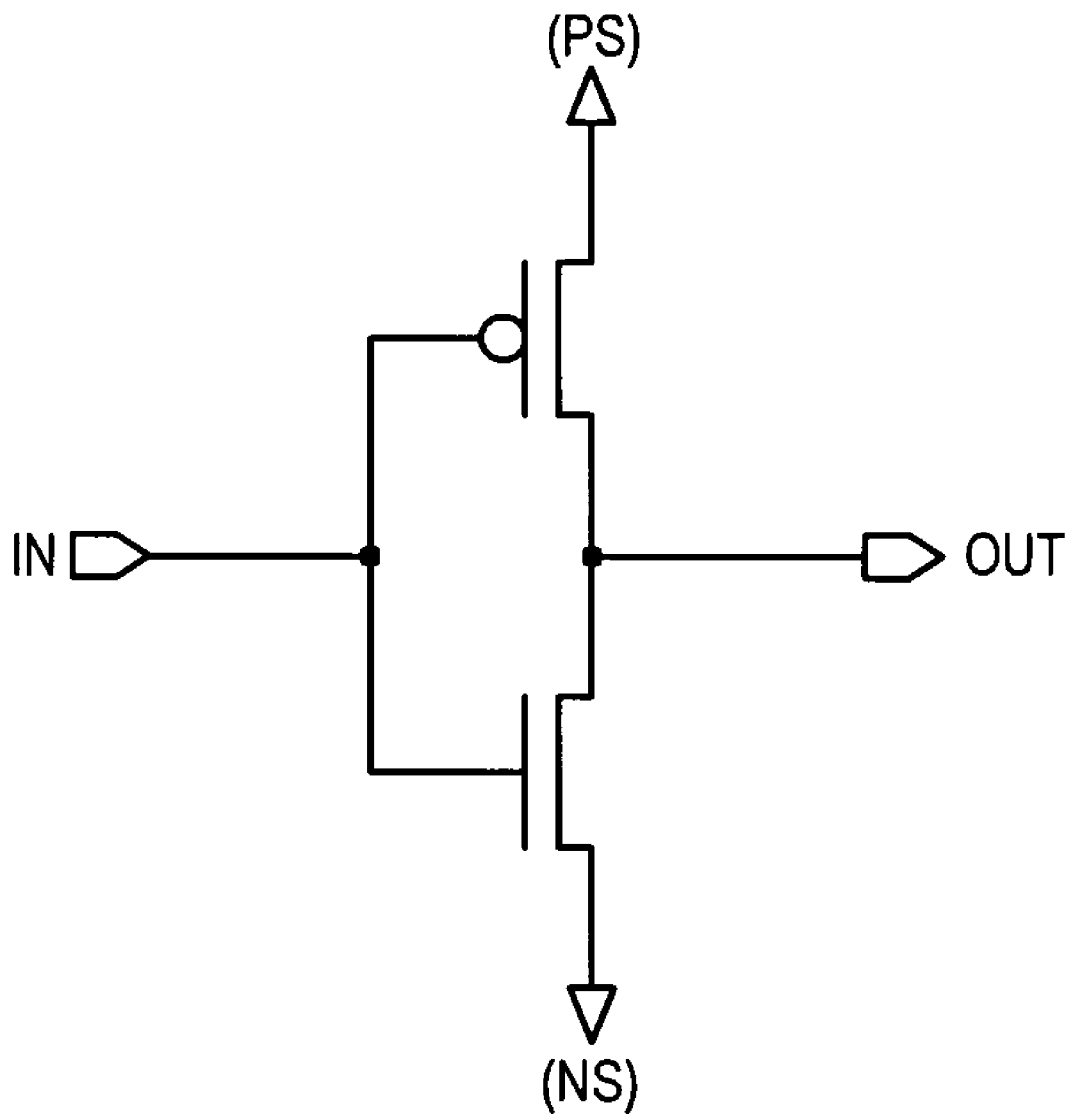
Figure 14:
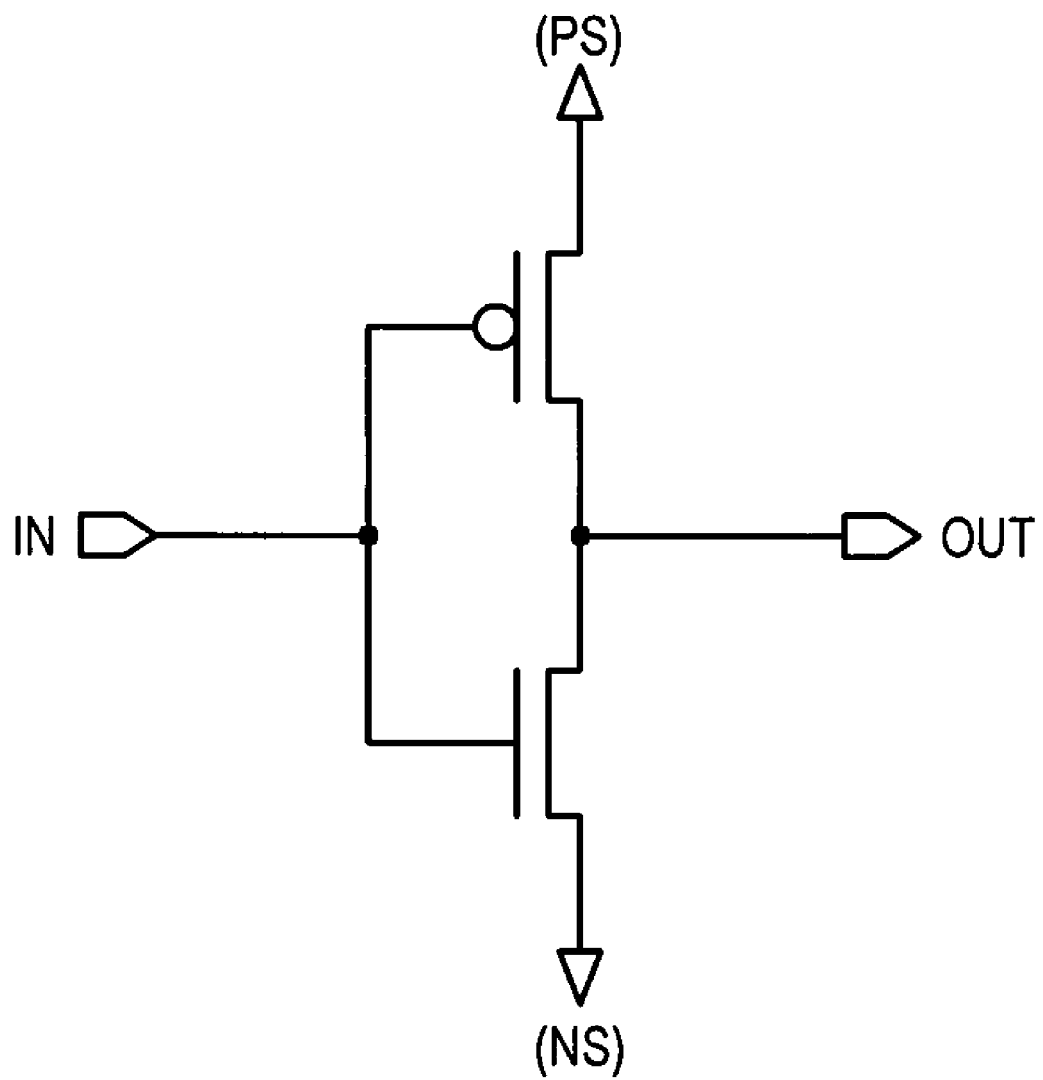
Figure 15:
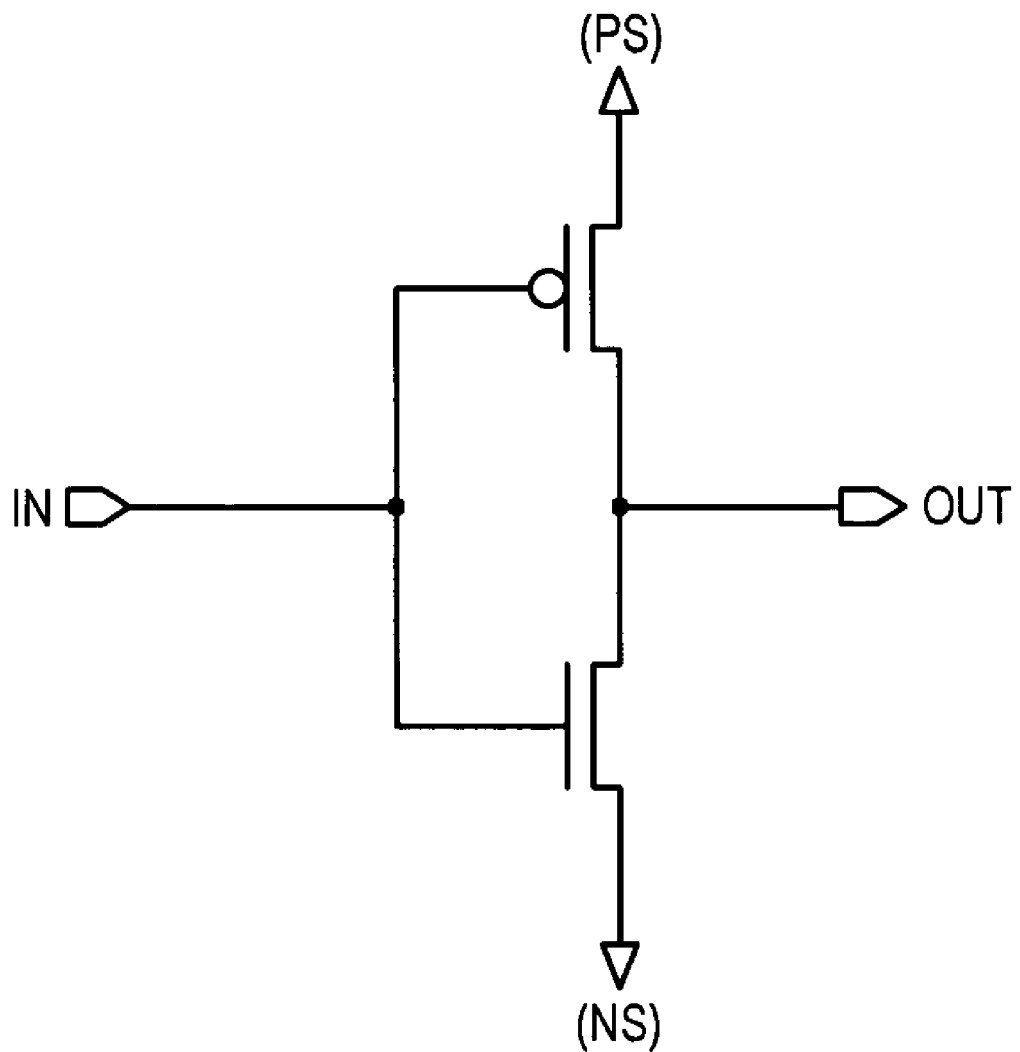
Figure 16:
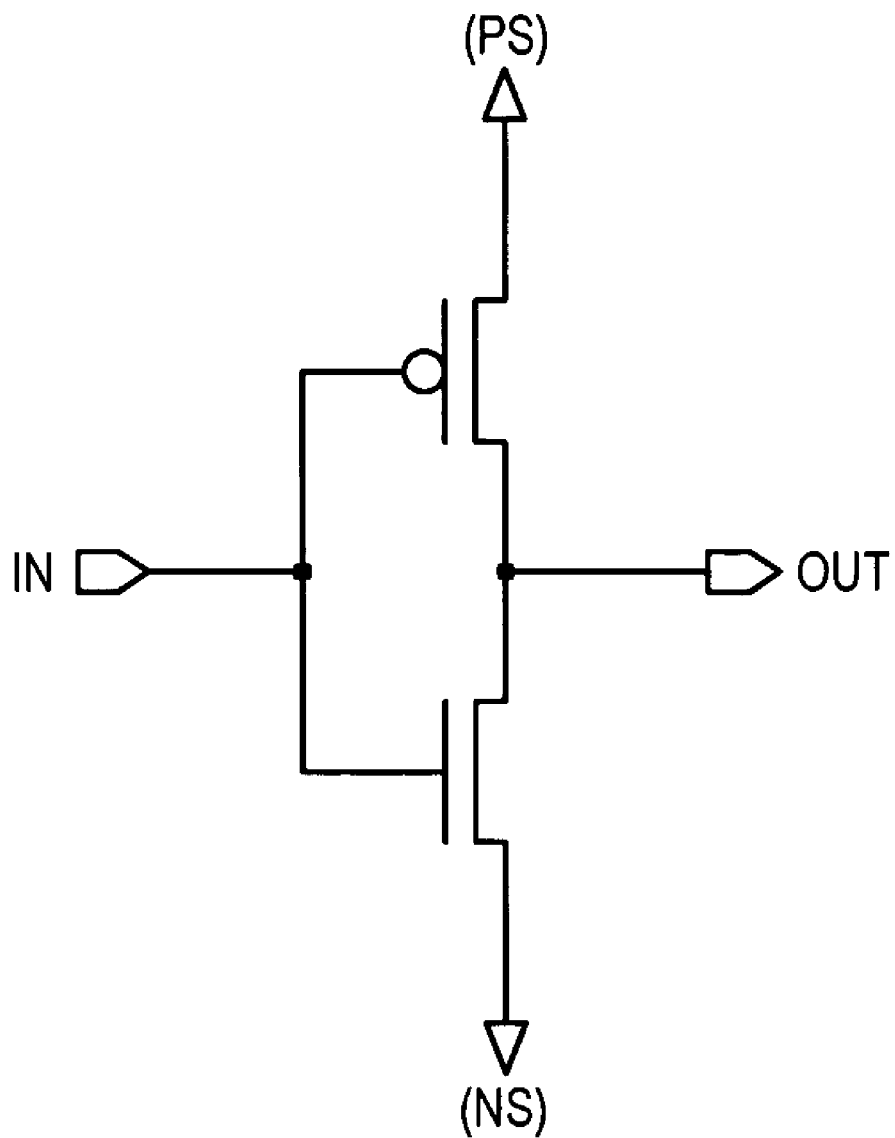
Figure 17:
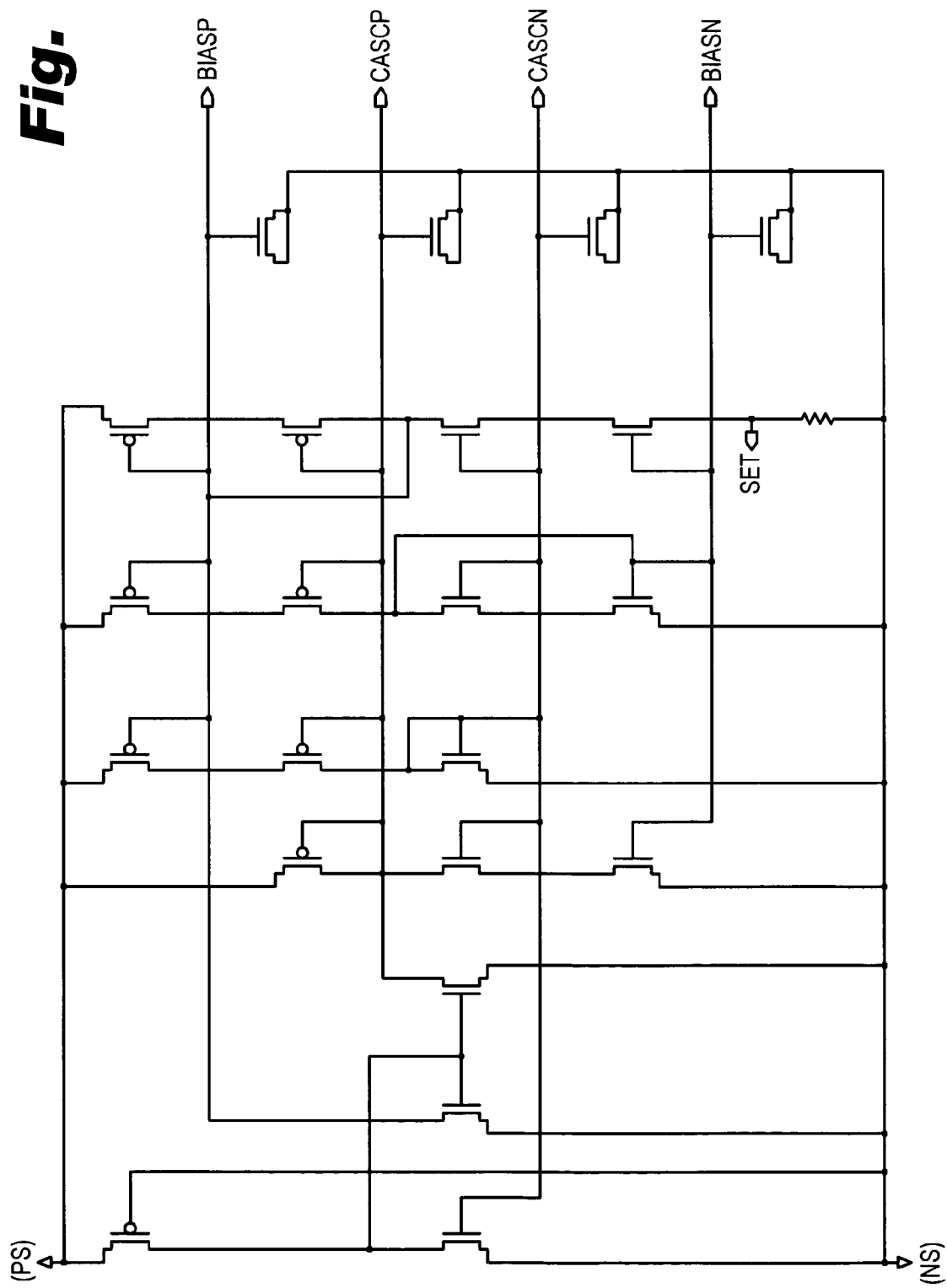
Figure 18:
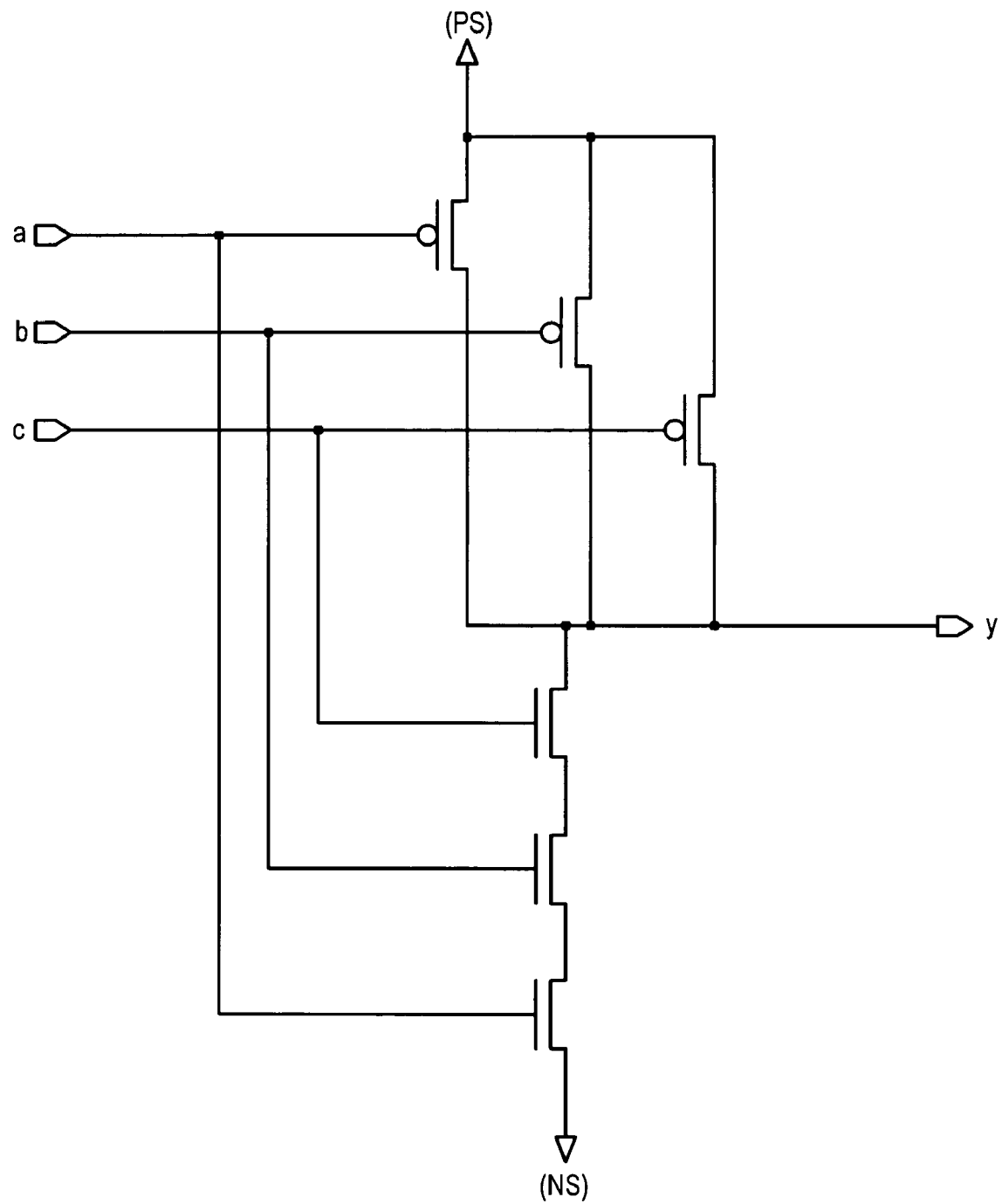
Figure 19:
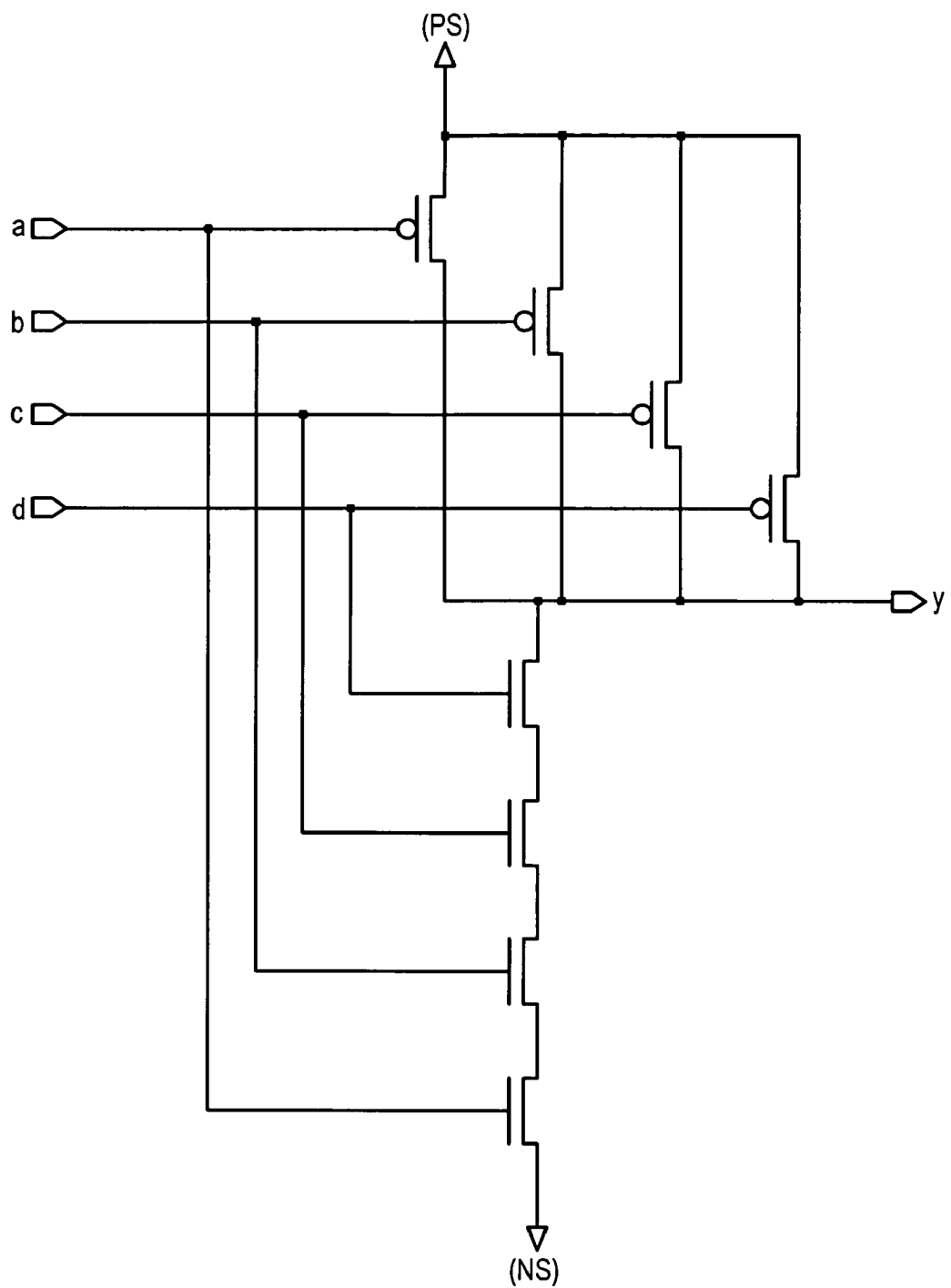
Figure 20:
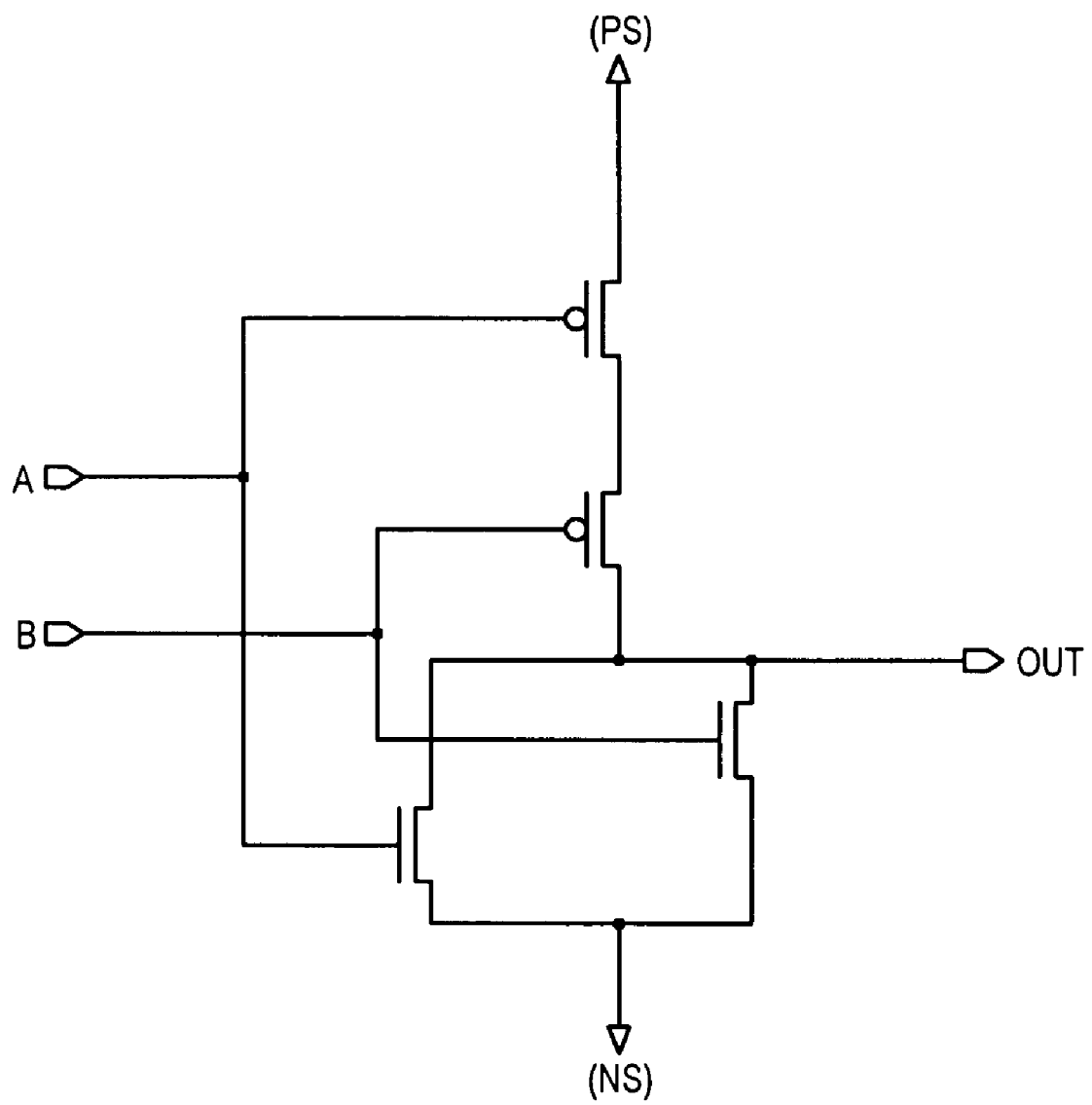
Figure 21:
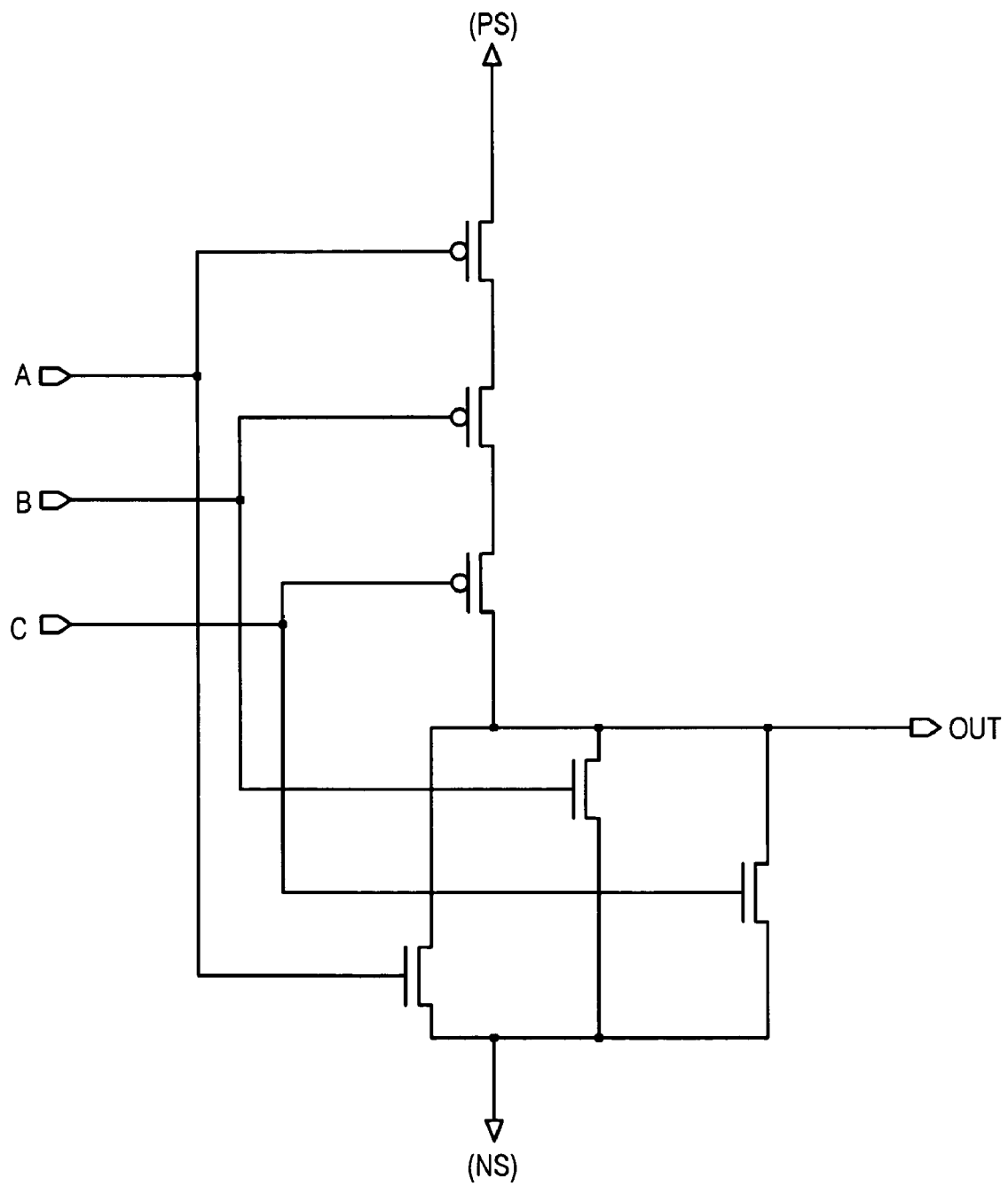
Figure 22:
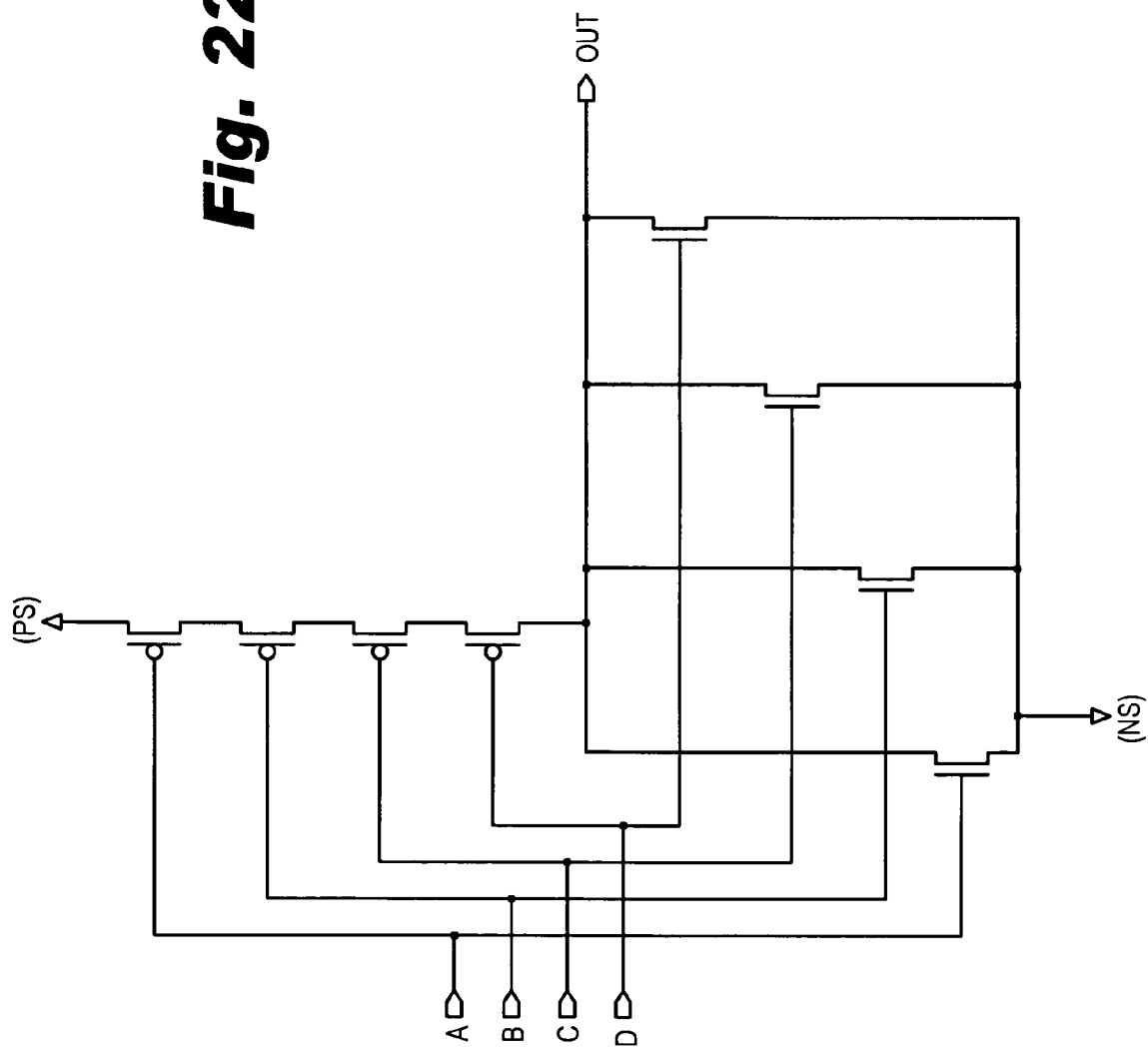
Figure 23:
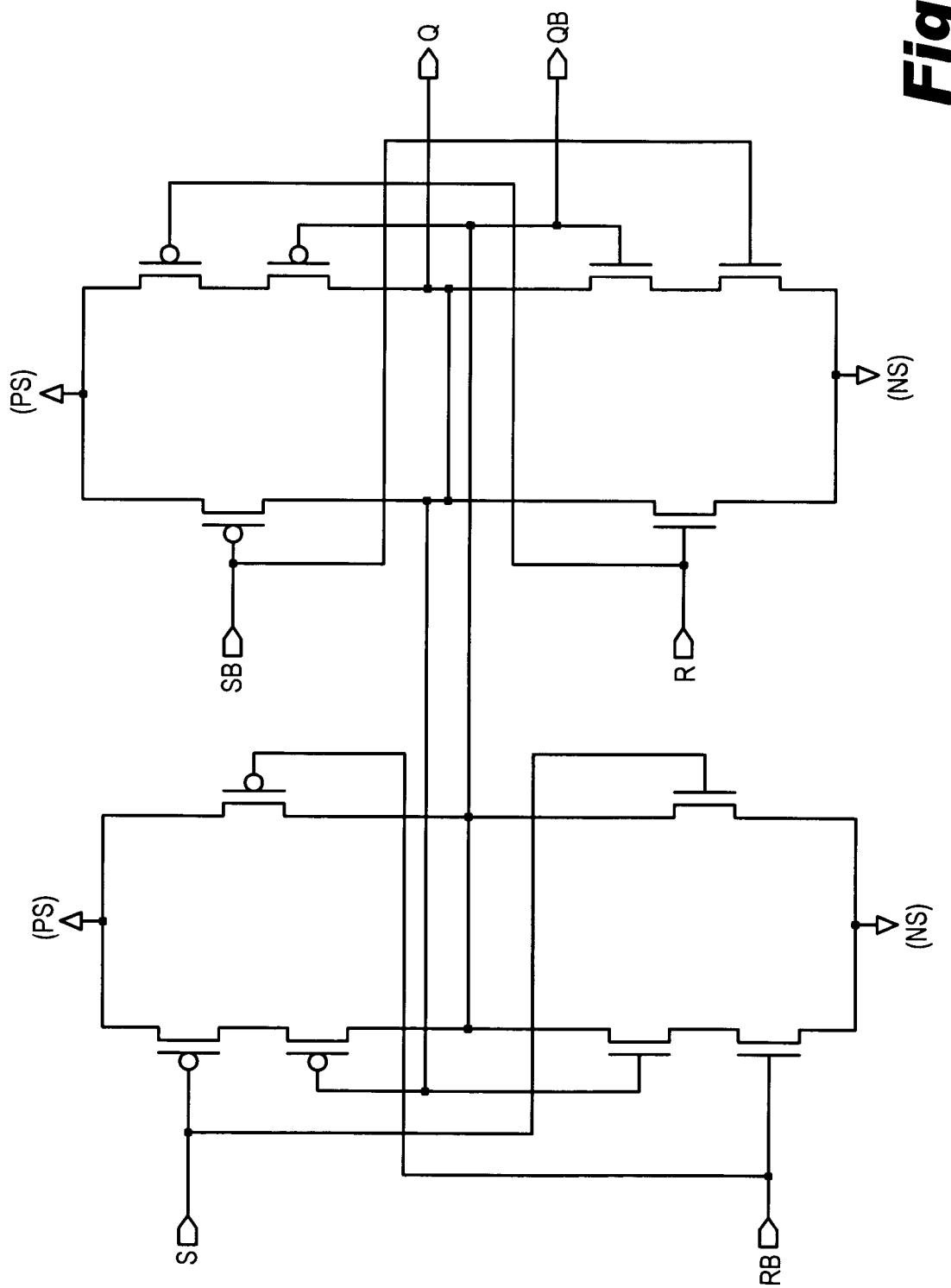
Figure 24:
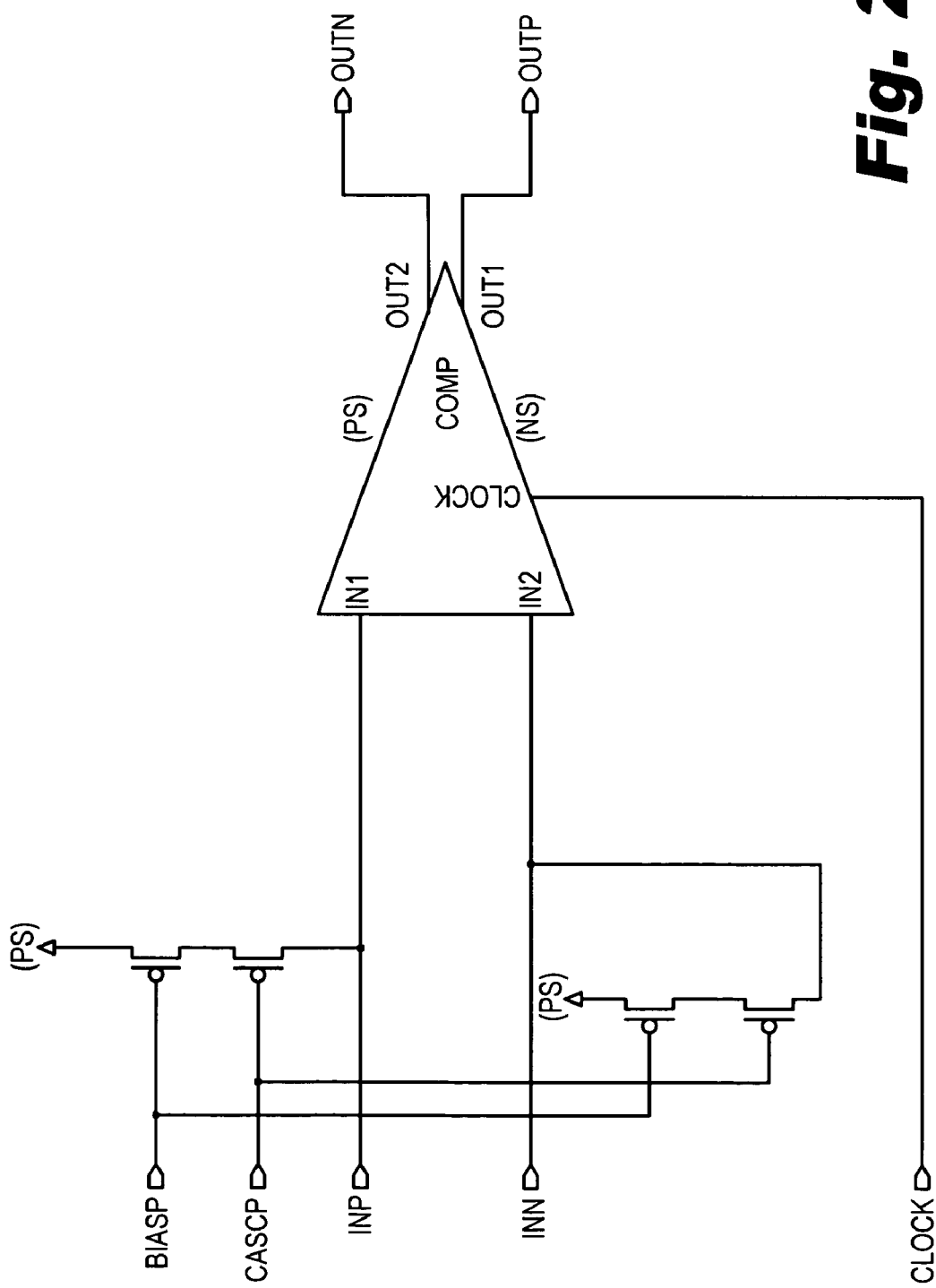
Figure 25:
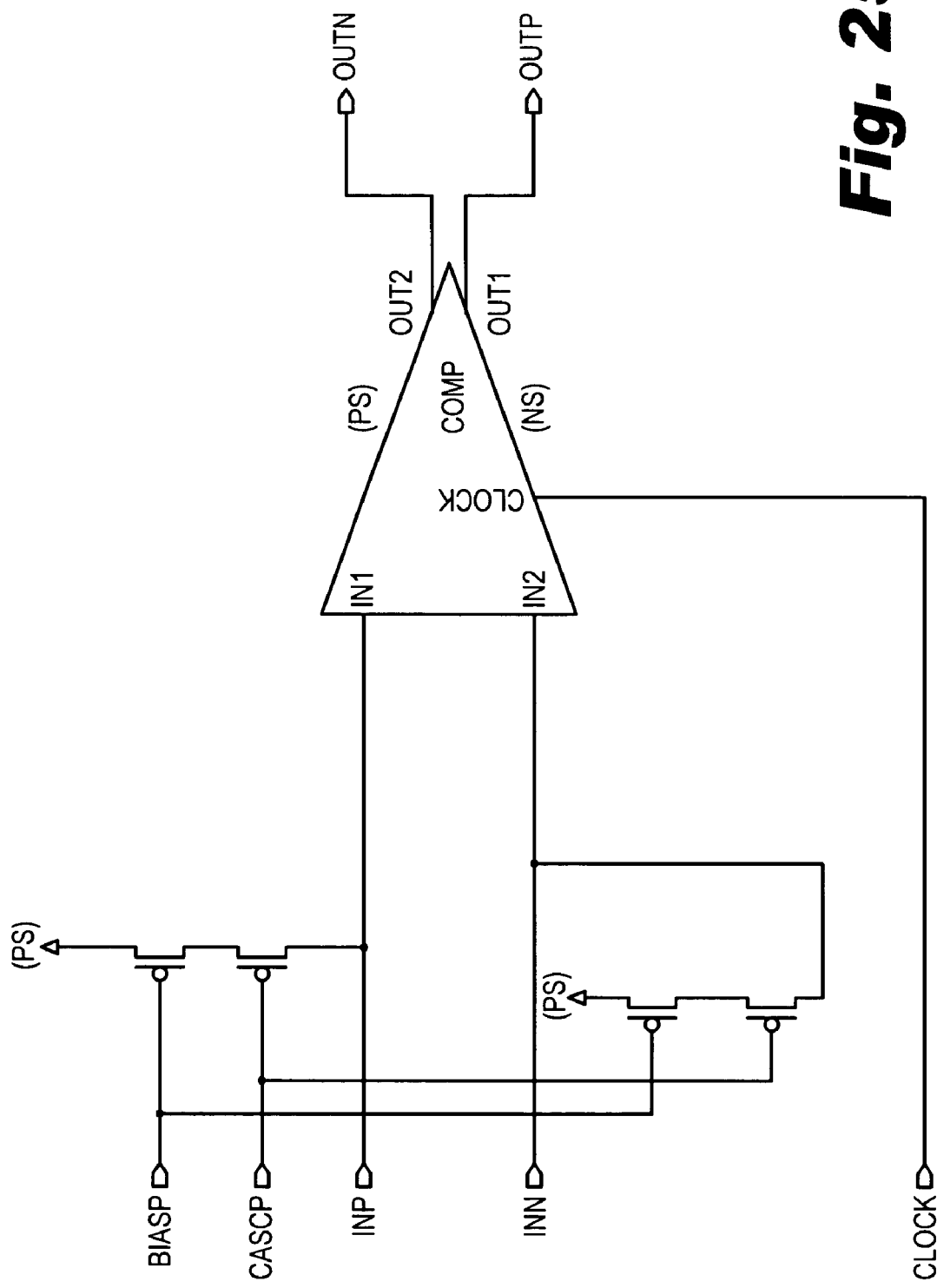
Figure 26:
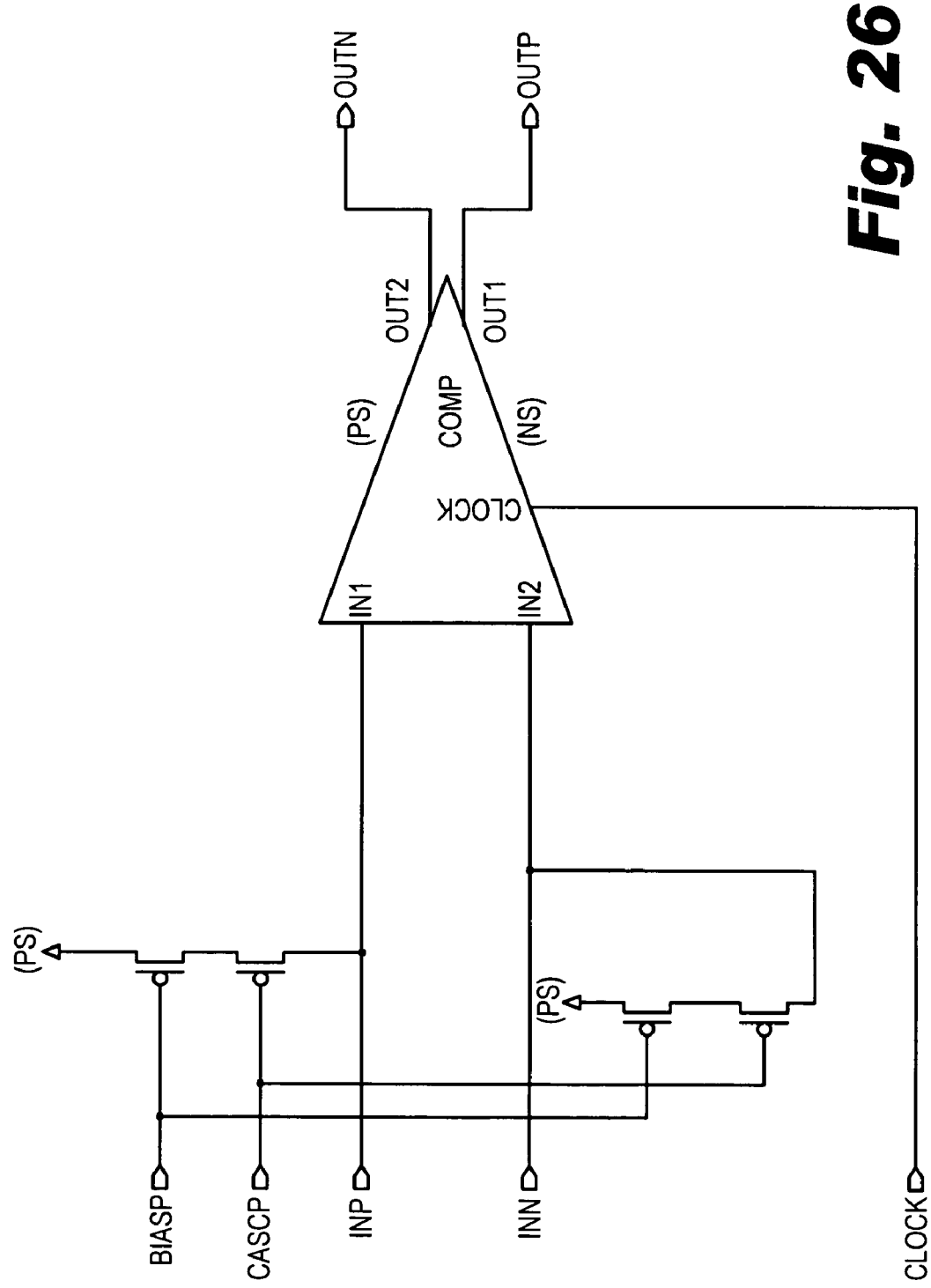
Figure 27:
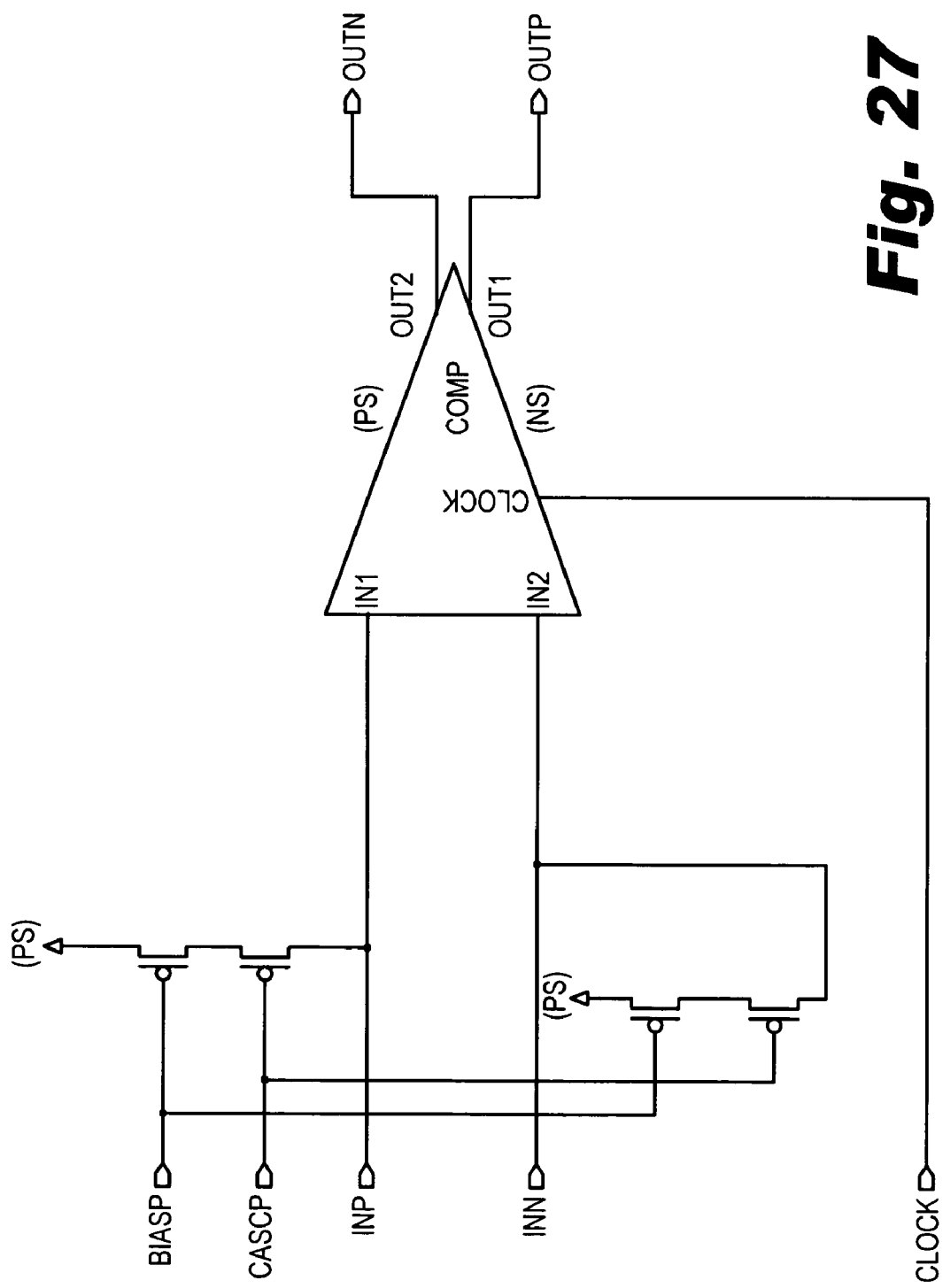
Figure 28:
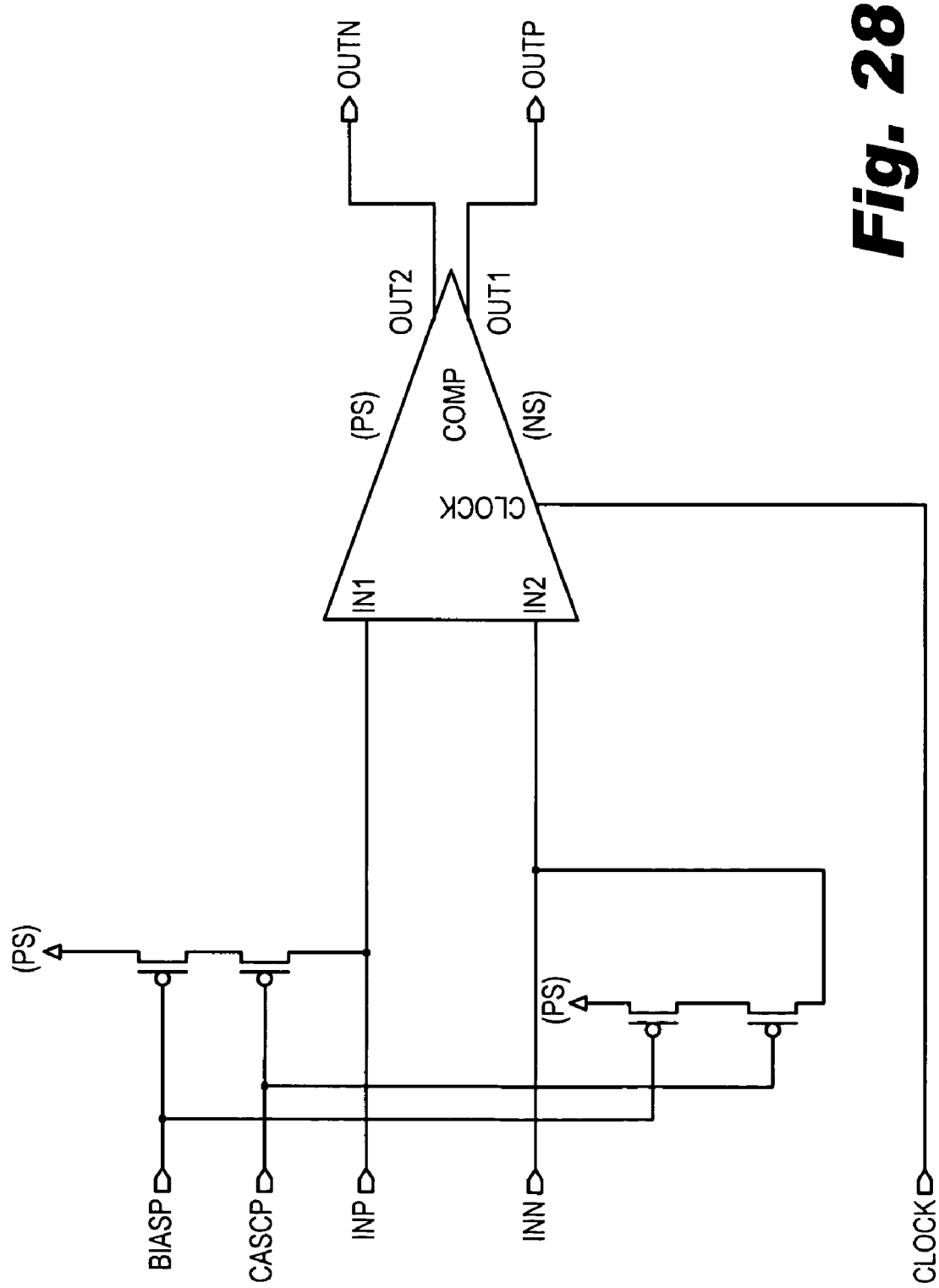
Figure 29:
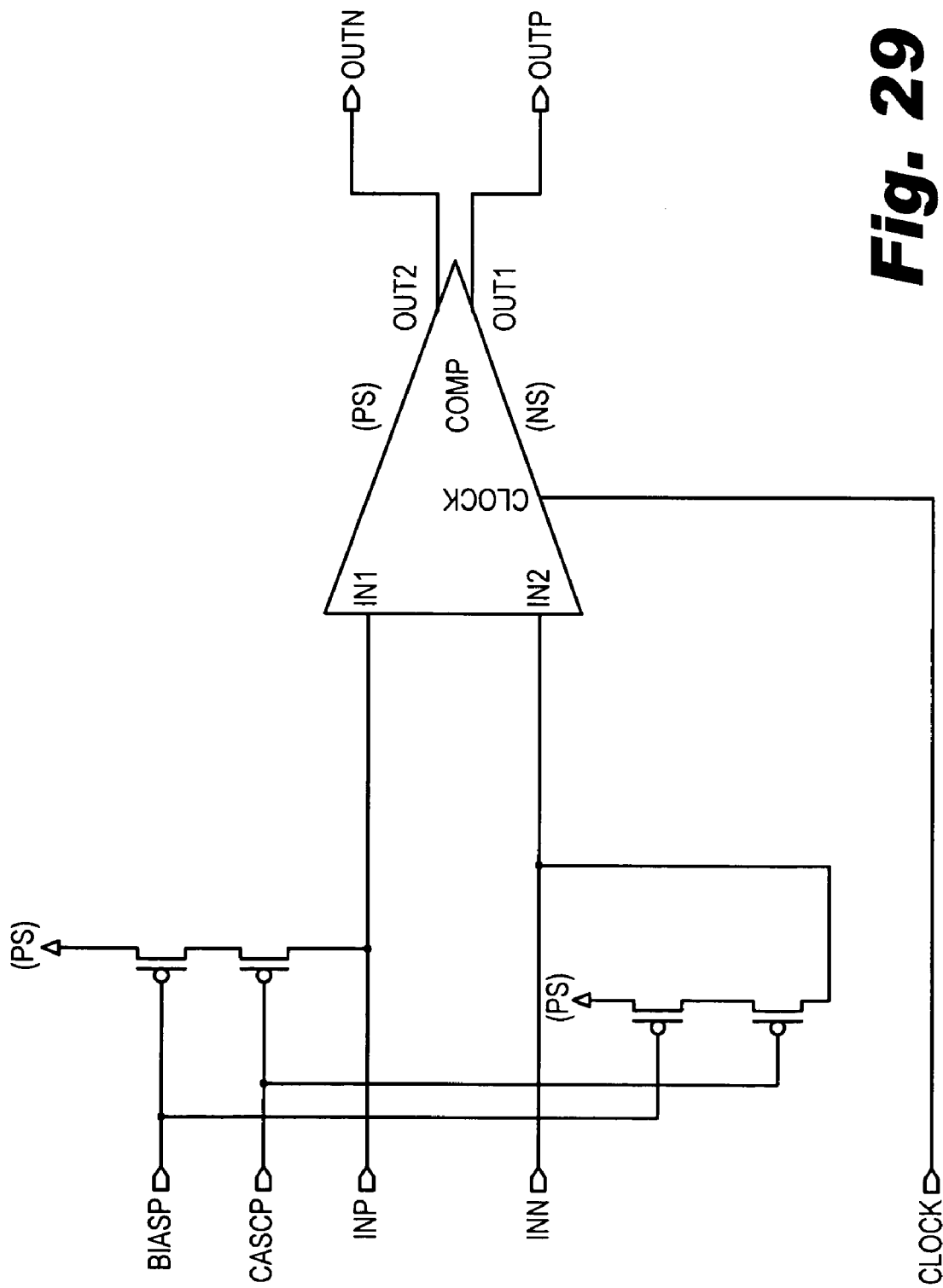
Figure 30:
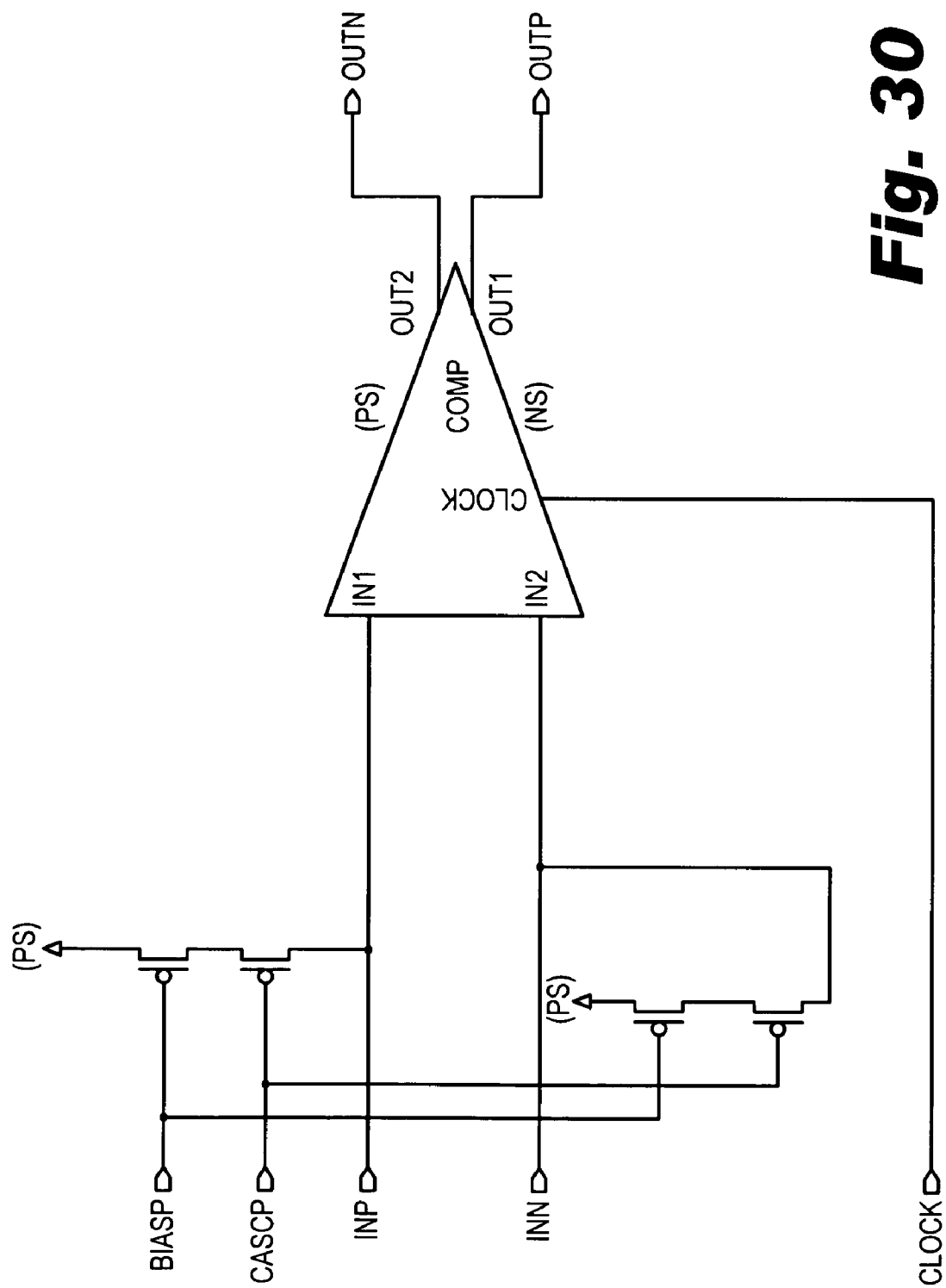
Figure 31:
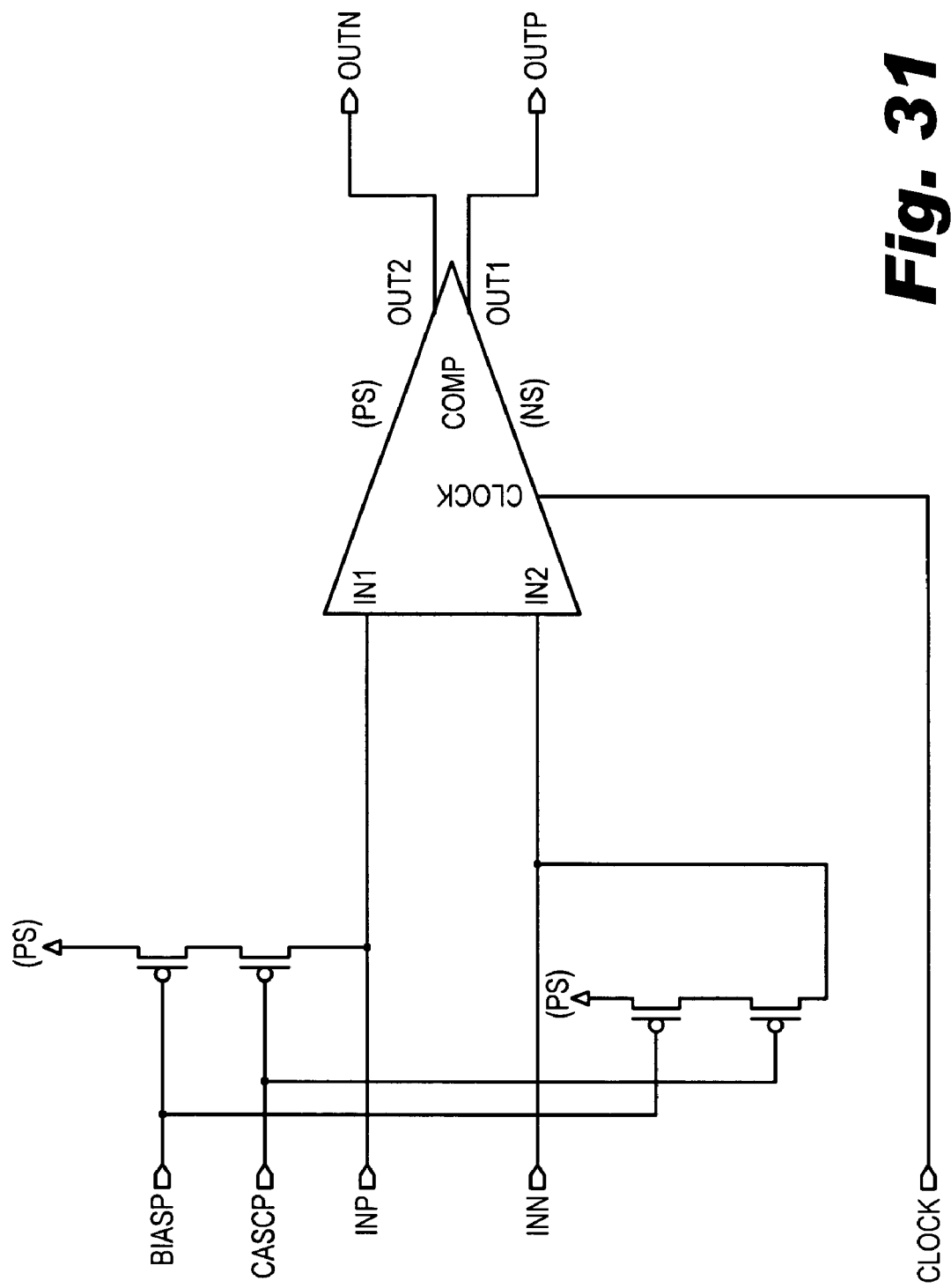
Figure 32:
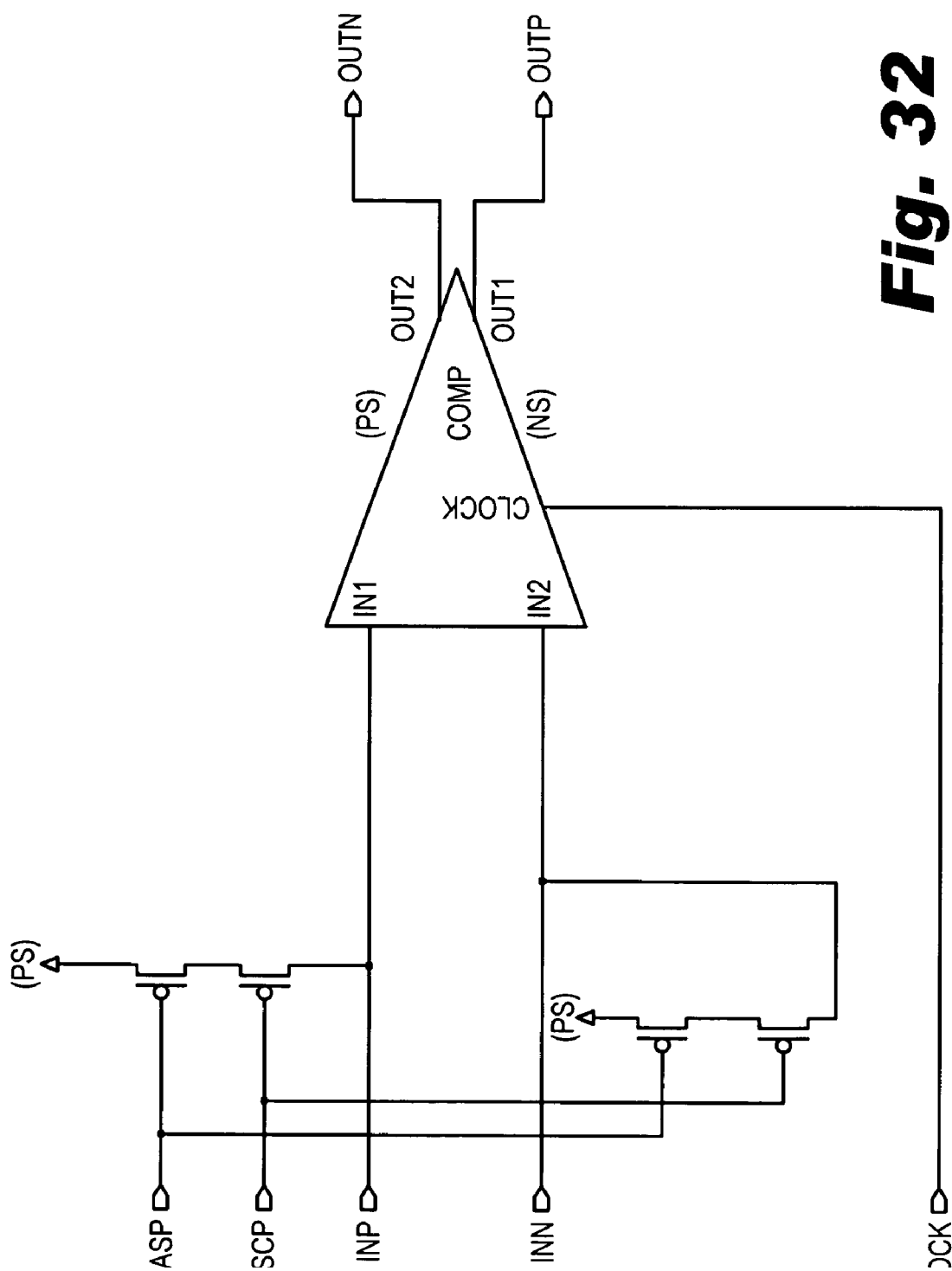
Figure 33:
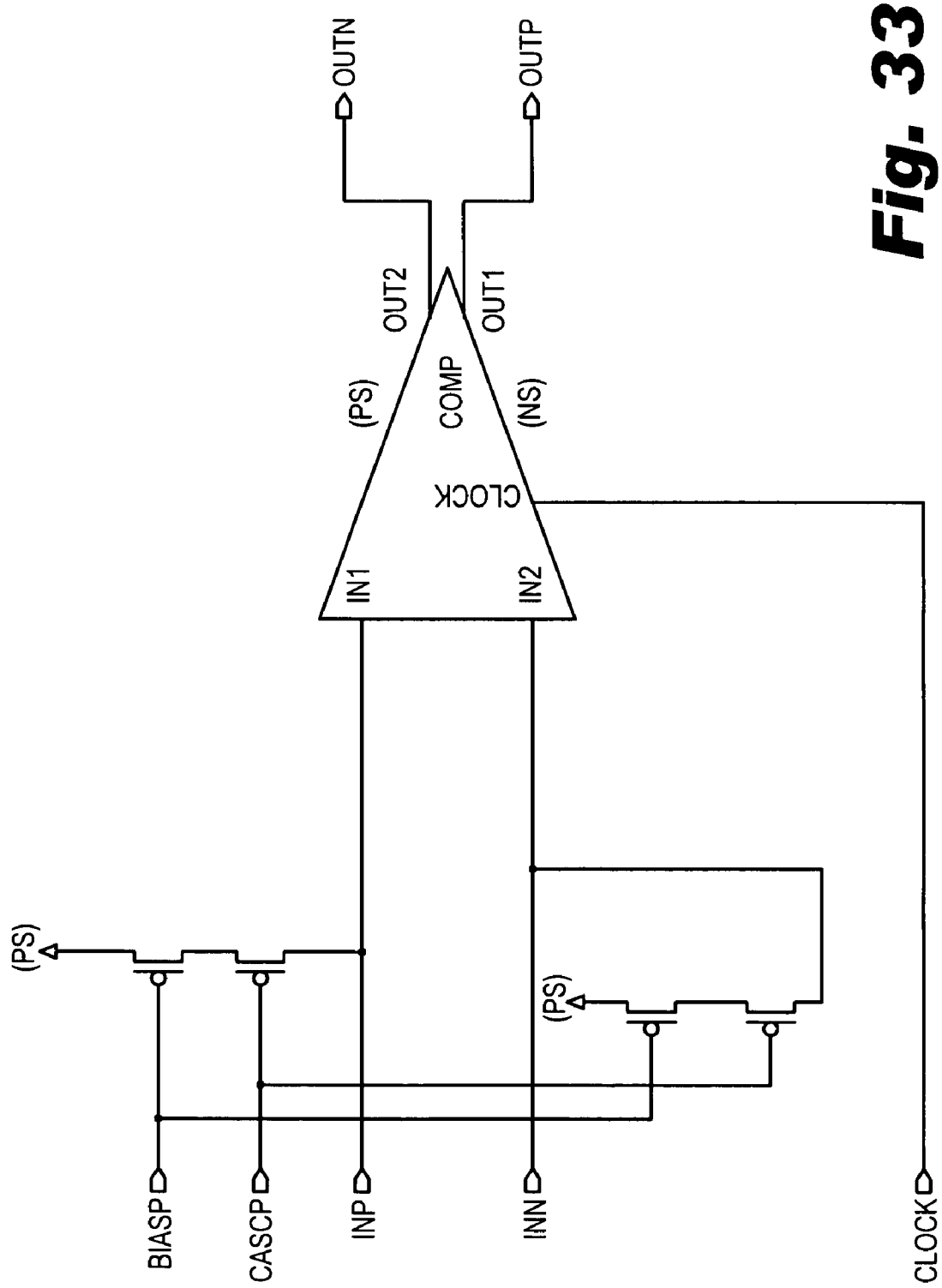
Figure 34:
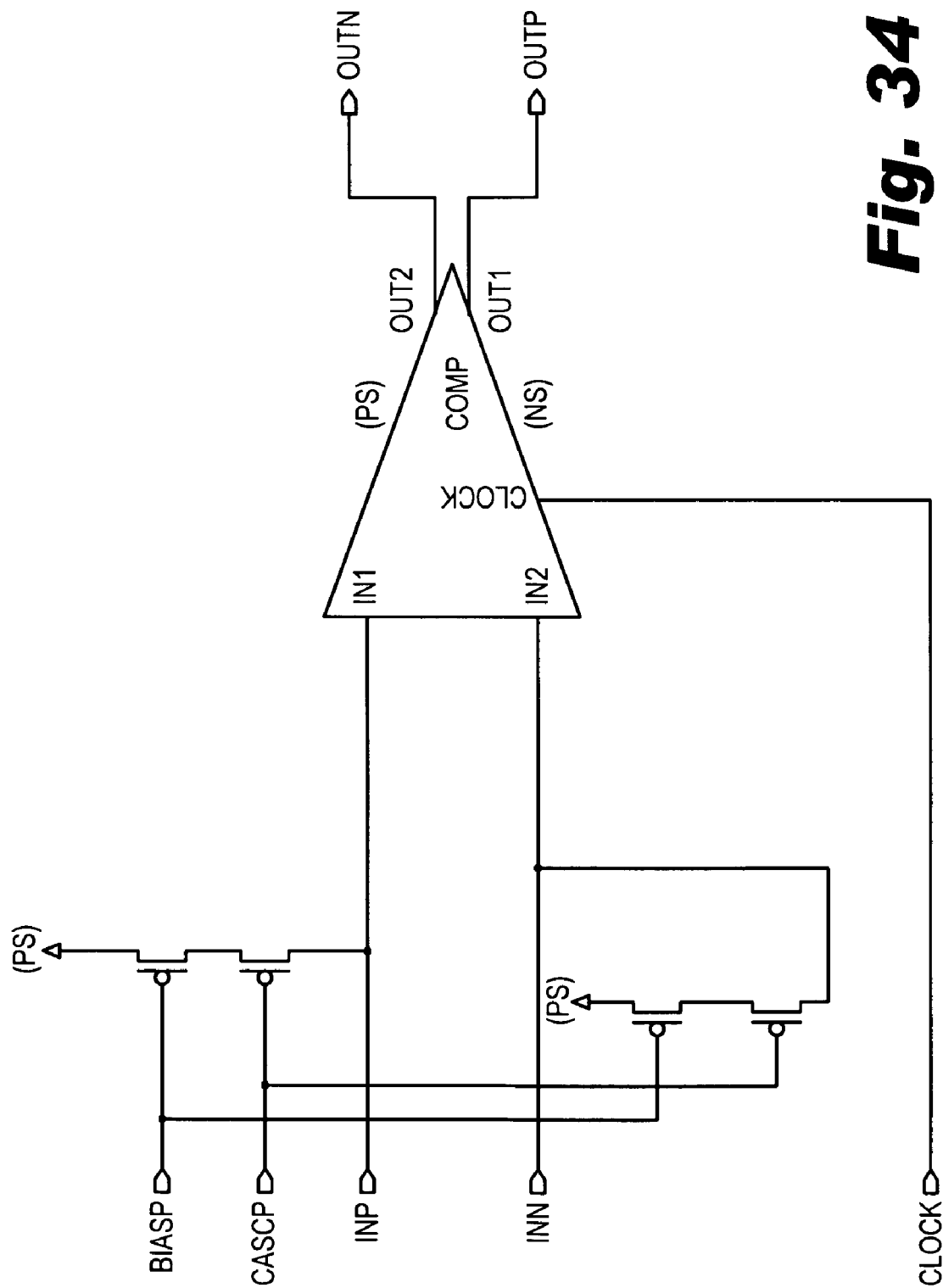
Figure 35:
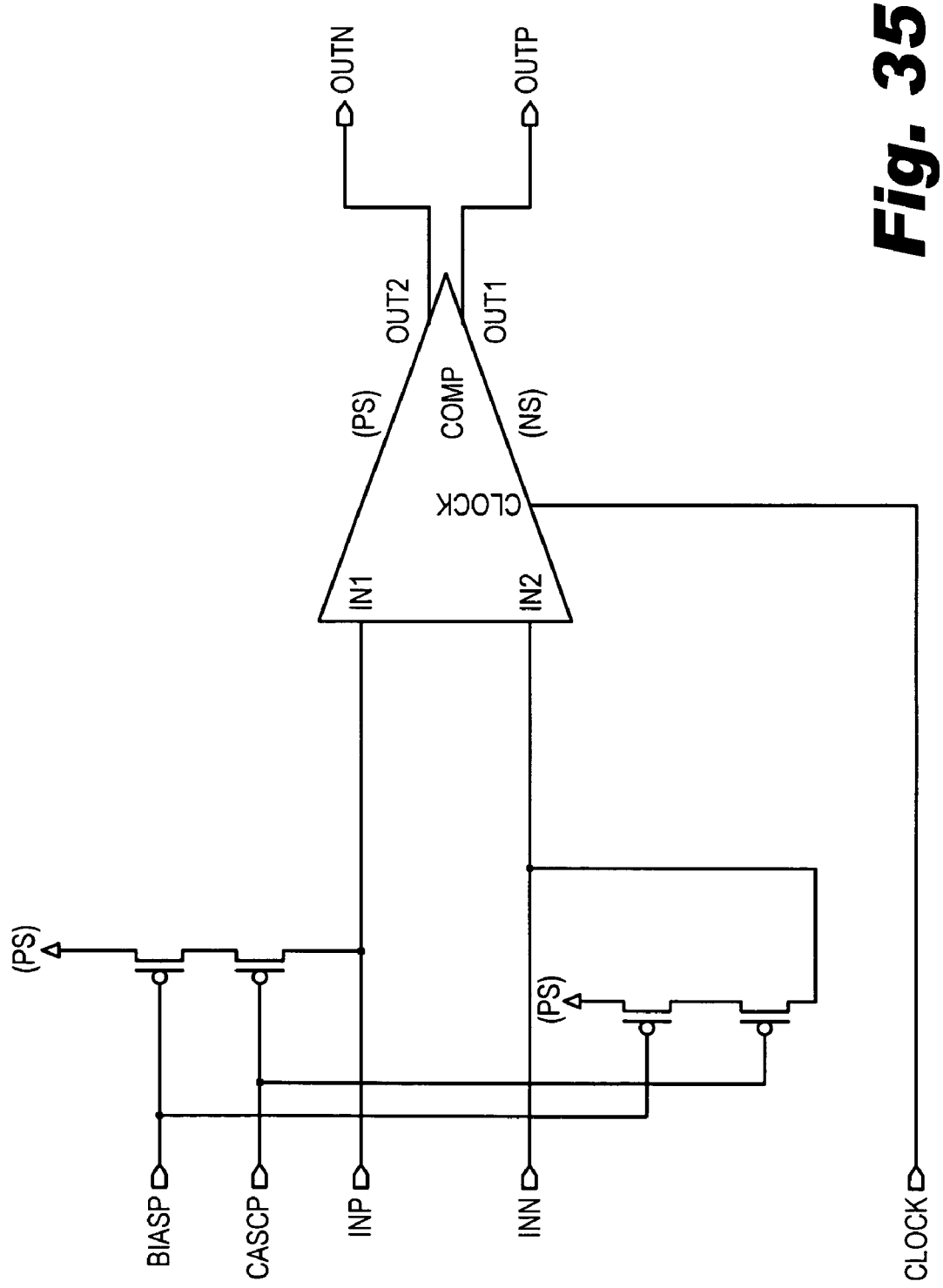
Figure 36:
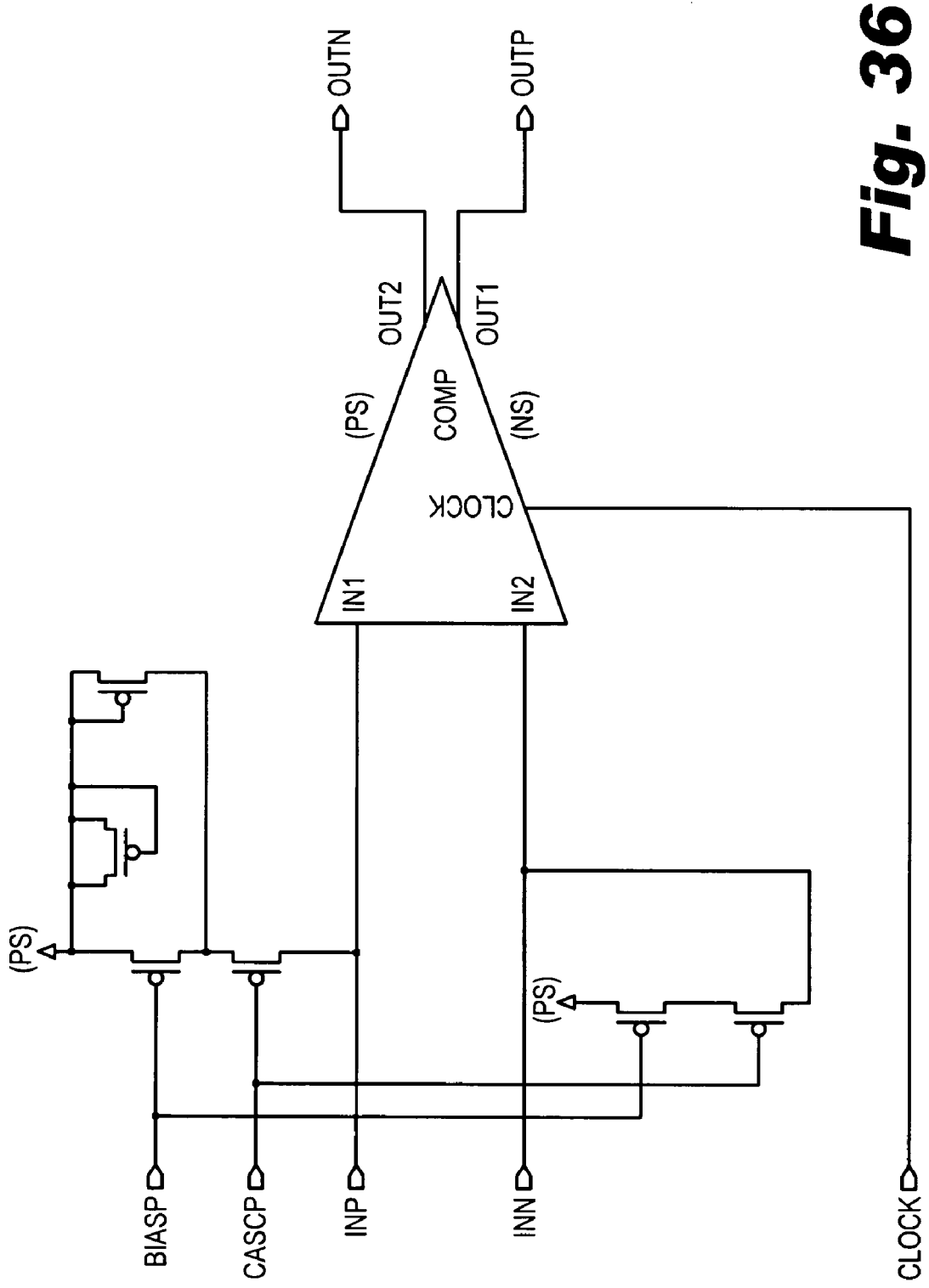
Figure 37:
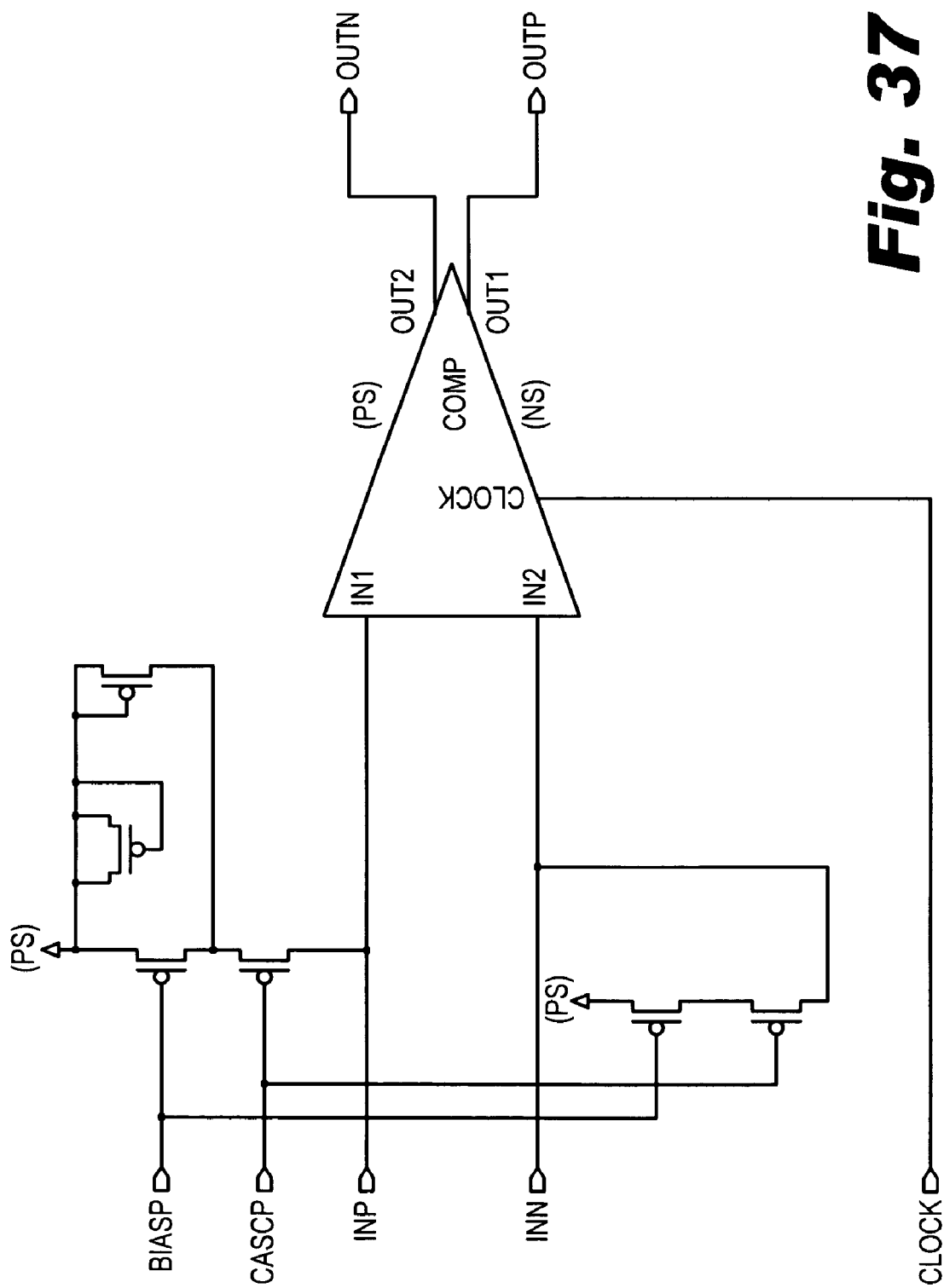
Figure 38:
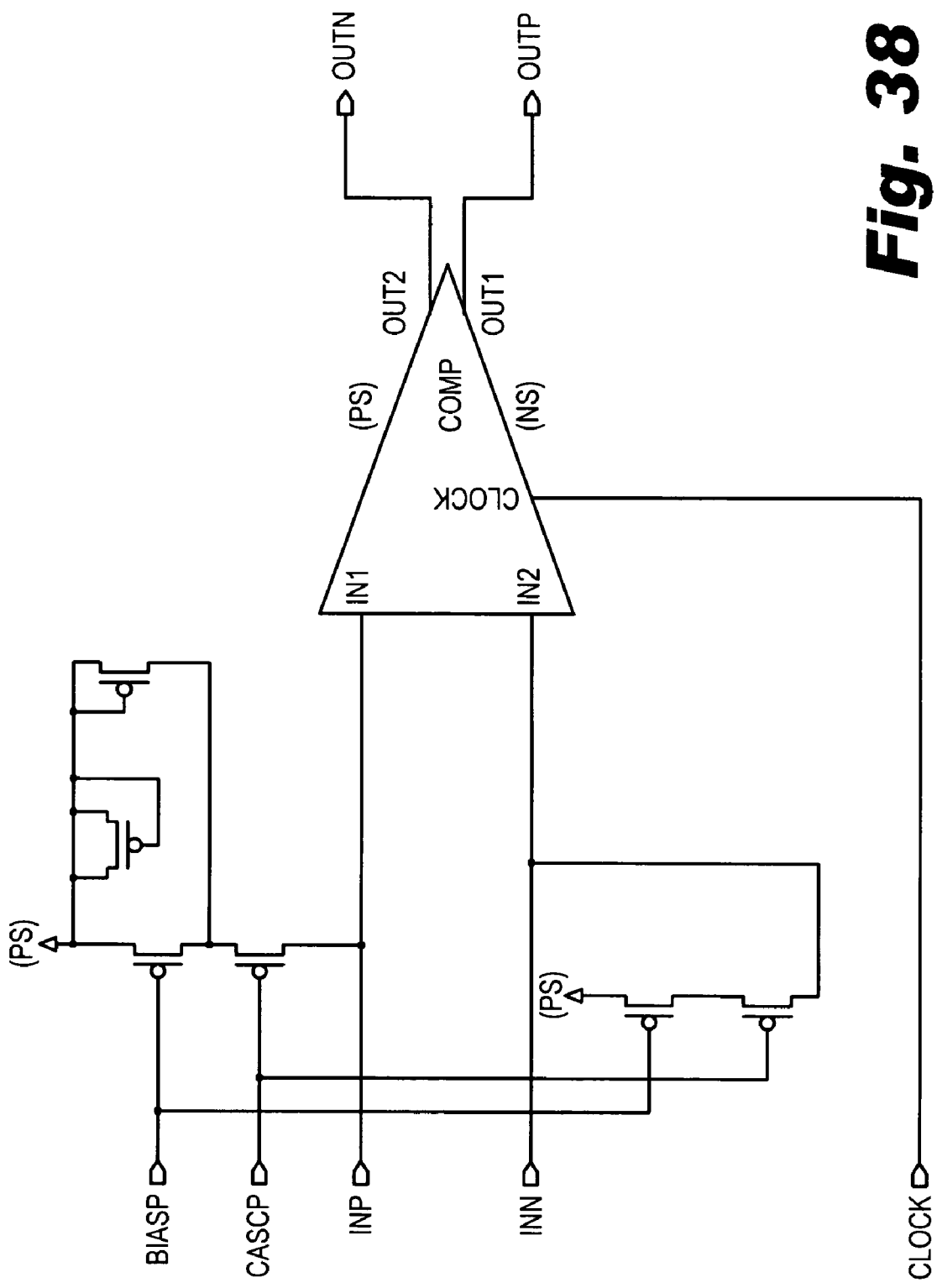
Figure 39:
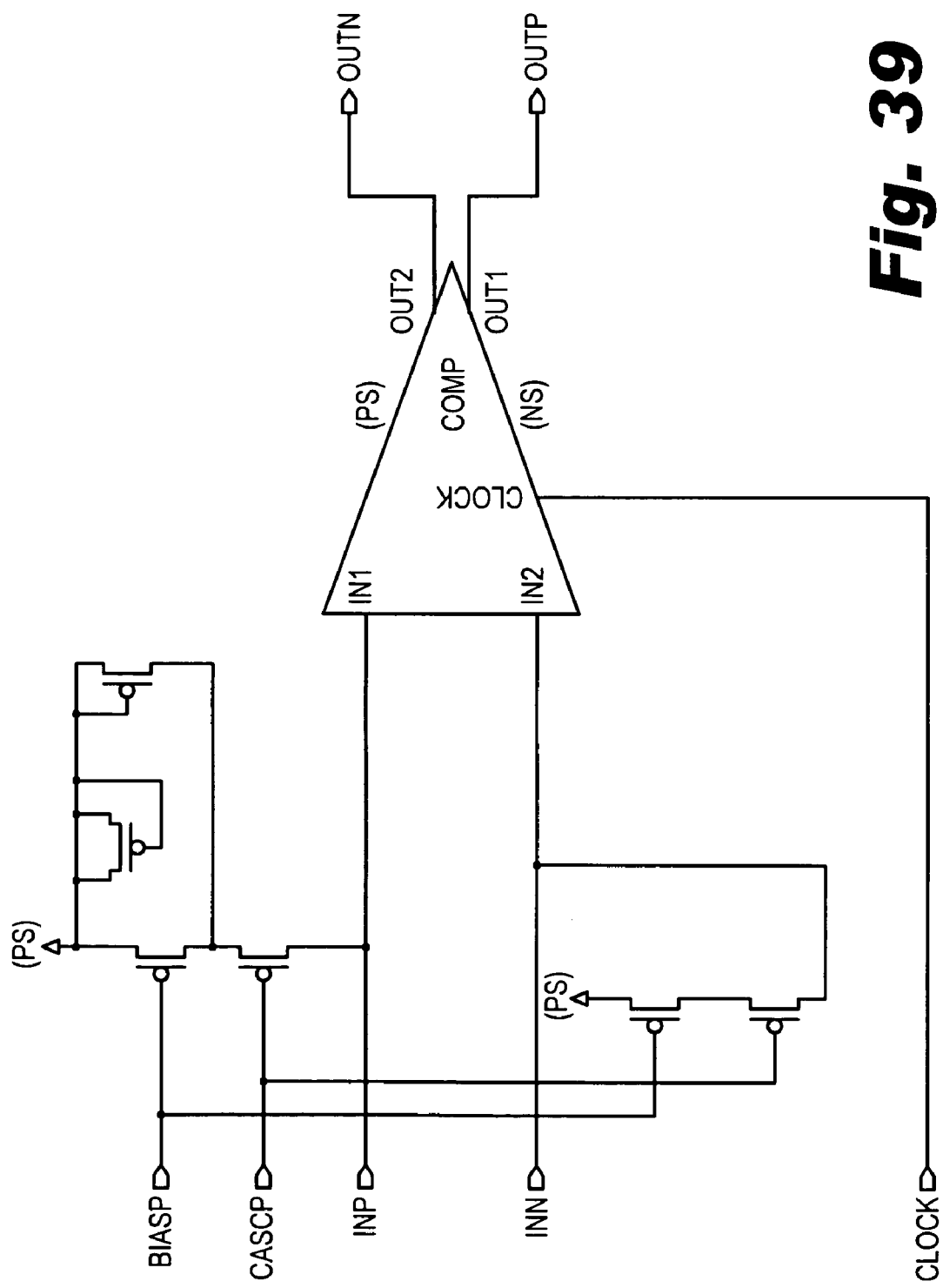
Figure 40:
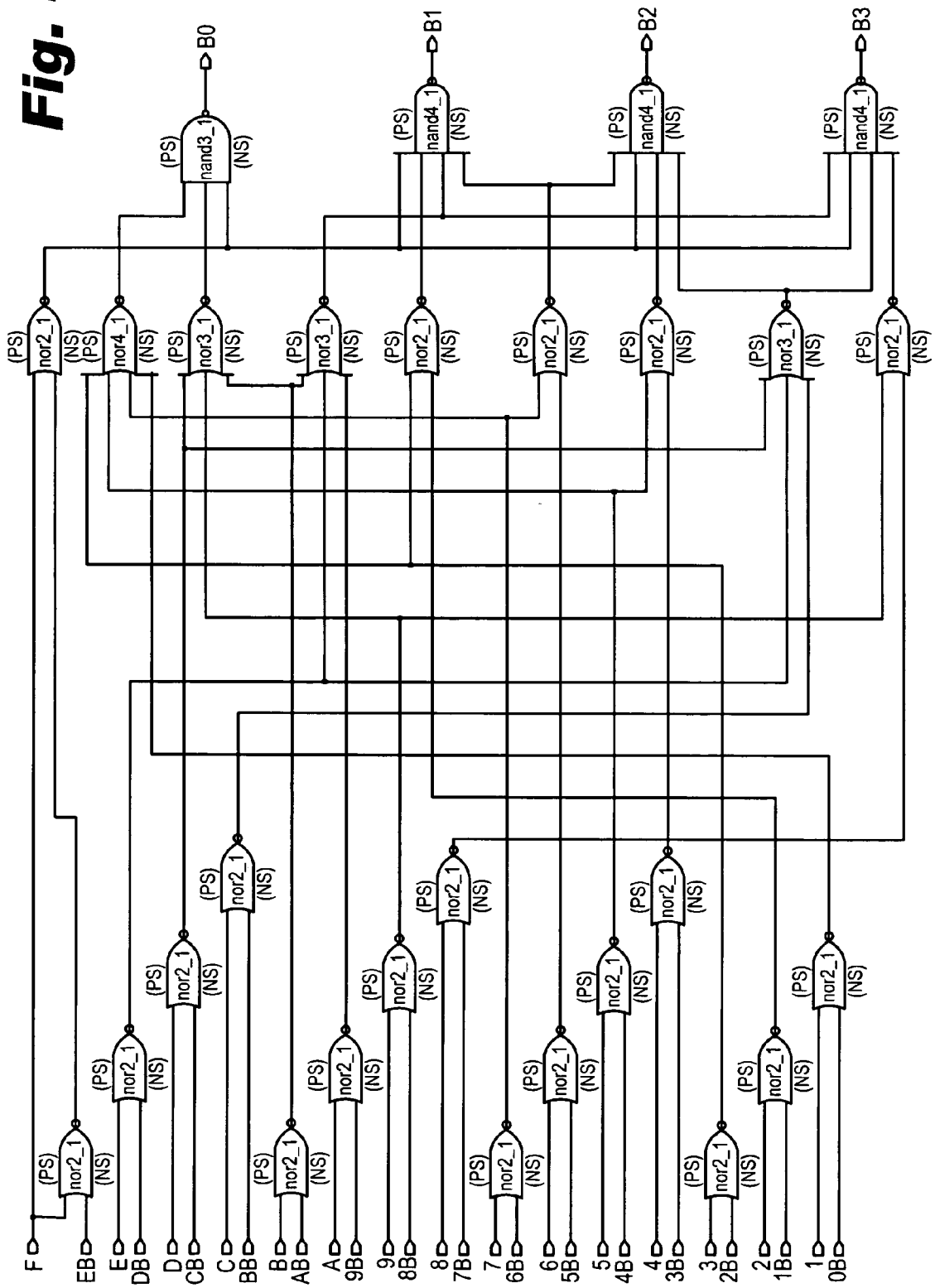

FIG. 4 shows an n bit, current-based ADC. Current comparators (410), (411), (412) and (413) are connected to a digital decoder (460). The comparator of FIG. 2 may be used as the comparators (410–413). The comparators (410–413) take current inputs and convert them to a digital output as described above. Elements (430), (431), (432), and (433) are current sources that add a DC bias to the input signal. Elements (420), (421), (422), and (423) are current sources with output currents scaled from I to N*I, where N is equal to 2^n. Because the inputs to the comparators (430–433) are currents, current replicators (450–453) and (440–443) may be provided to allow for combining the currents into the comparators.

The digital decoder (460) shown in FIG. 4 is a digital, thermometer code to binary converter which takes the data from the N comparators and converts the data into an n bit binary signal. The digital decoder (460) may also contain error detection or correction circuitry.

FIGS. 5–40 are circuit schematics showing various additional embodiments of the novel current-based analog-to-digital converters and conversion techniques described herein.

The preceding description has been presented only to illustrate and describe examples of the invention. It is not intended to be exhaustive or to limit the invention to any precise form disclosed. It is intended that the scope of the invention be defined by the following claims.

What is claimed is:

1. An Analog-to-Digital Converter for converting an analog signal to a digital signal, comprising:
   a plurality of current sources configured to generate a number of scaled reference currents;
   a plurality of current comparators each configured to compare a difference between a first input current and a second input current with one of said scaled reference currents and generate an output current signal based on said comparison; and
   a digital decoder configured to receive each of said output current signals and generate a digital representation of said analog signal based on each of said output current signals.

2. The converter of claim 1, wherein:
   said plurality of comparators comprises 2^N current comparators; and
   said plurality of current sources comprises 2^N current sources;
   wherein N is an integer greater than or equal to zero.

3. The converter of claim 1, wherein said plurality of comparators comprises a plurality of sense amps.

4. The converter of claim 3, wherein each of said sense amps comprises a current mirror.

5. The converter of claim 1, wherein said converter is configured operate without converting one or more of said scaled reference currents, said input currents, and said output current signal to one or more voltages.

6. The converter of claim 2, wherein said scaled reference currents comprise N different current levels.

7. A method of converting an analog signal to a digital signal comprising:
   generating a number of scaled reference currents;
   providing a plurality of current comparators each configured to compare a difference between a first input current and a second input current with one of said scaled reference currents and generate an output current signal based on said comparison; and
   generating a digital representation of said analog signal based on each of said output current signals.

8. The method of claim 7, further comprising providing a plurality of current sources, wherein said current sources are configured to generate said scaled reference currents.

9. The method of claim 8, wherein:
said plurality of comparators comprises $2^N$ current comparators; and
said plurality of current sources comprises $2^N$ current sources;
wherein where N is an integer greater than or equal to zero.

10. The method of claim 7, wherein said plurality of current comparators comprises a plurality of sense amps.

11. The method of claim 10, wherein each of said sense amps comprises a current mirror.

12. The method of claim 9, wherein said scaled reference currents comprise N different current levels.

13. A system for converting an analog signal to a digital signal, comprising:
means for generating a plurality of scaled reference currents;
means for comparing a difference between a first input current and a second input current with one of said scaled reference currents;
means for generating an output current signal based on said comparison; and
means for receiving said output current signal and generating a digital representation of said analog signal based on said output current signal.

14. The system of claim 13, wherein said means for comparing comprises a plurality of current comparators.

15. The system of claim 13, wherein said means for generating said scaled reference currents comprises $2^N$ reference current generators and said means for comparing comprises $2^N$ current comparators, where N is an integer greater than or equal to zero.

16. The system of claim 13, wherein said means for comparing comprises a plurality of sense amps.

17. The system of claim 14, wherein each of said sense amps comprises a current mirror.

18. The system of claim 13, wherein said system is configured operate without converting one or more of said scaled reference currents, said input currents, and said output current signals to one or more voltages.

19. The system of claim 15, wherein said scaled reference currents comprise N different current levels.

* * * * *